(12) United States Patent
Takei et al.

(10) Patent No.: US 8,772,431 B2
(45) Date of Patent: Jul. 8, 2014

(54) SILANOL CONDENSATION CATALYST, HEAT-CURABLE SILICONE RESIN COMPOSITION FOR SEALING PHOTOSEMICONDUCTORS AND SEALED PHOTOSEMICONDUCTOR USING SAME

(75) Inventors: Yoshihito Takei, Kanagawa (JP); Kazunori Ishikawa, Kanagawa (JP); Takeaki Saiki, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 243 days.

(21) Appl. No.: 13/139,934

(22) PCT Filed: Dec. 8, 2009

(86) PCT No.: PCT/JP2009/070797
§ 371 (c)(1),
(2), (4) Date: Jun. 15, 2011

(87) PCT Pub. No.: WO2010/071092
PCT Pub. Date: Jun. 24, 2010

(65) Prior Publication Data
US 2011/0248314 A1    Oct. 13, 2011

(30) Foreign Application Priority Data

Dec. 16, 2008  (JP) .................................. 2008-319494
Nov. 12, 2009  (JP) .................................. 2009-259129

(51) Int. Cl.
*C08G 77/04*   (2006.01)

(52) U.S. Cl.
USPC ............................................. 528/34; 528/12

(58) Field of Classification Search
USPC ...................................................... 528/34, 12
See application file for complete search history.

(56) References Cited

U.S. PATENT DOCUMENTS 4,737,562 A    4/1988  Chaudhury et al.
5,068,150 A *  11/1991 Nakamura et al. ............ 428/407

FOREIGN PATENT DOCUMENTS

| EP | 0 304 958 A2 | 3/1989 |
|---|---|---|
| GB | 1 547 237 A | 6/1979 |
| JP | 63-105058 A | 5/1988 |
| JP | 64-60656 A | 3/1989 |
| JP | 2-196860 A | 8/1990 |
| JP | 5-331370 A | 12/1993 |
| JP | 10-228249 A | 8/1998 |
| JP | 2001-200161 A | 7/2001 |
| JP | 2006-206700 A | 8/2006 |
| JP | 2007-224089 A | 9/2007 |
| JP | 2007-320998 A | 12/2007 |
| JP | 2008-94918 A | 4/2008 |
| JP | 2008-208160 A | 9/2008 |
| JP | 2008-274272 A | 11/2008 |
| JP | 2009-132797 A | 6/2009 |
| JP | 4385078 B1 | 12/2009 |
| JP | 2010-43136 A | 2/2010 |

OTHER PUBLICATIONS

International Search Report of corresponding International Application No. PCT/JP2009/070797, dated on Mar. 9, 2010.

* cited by examiner

*Primary Examiner* — Kuo-Liang Peng
(74) *Attorney, Agent, or Firm* — Global IP Counselors, LLP

(57) ABSTRACT

A silanol condensation catalyst including at least the zirconium metal salt expressed by Formula (I) below (wherein n is an integer from 1 to 3; each $R^1$ is a hydrocarbon group having from 1 to 16 carbons; and each $R^2$ is a hydrocarbon group having from 1 to 18 carbons.) A heat-curable silicone resin composition for sealing optical semiconductors includes 100 parts by mass of a polysiloxane containing two or more silanol groups in the molecule; from 0.1 to 2,000 parts by mass of a silane compound containing two or more alkoxy groups that are bonded to a silicon atom in the molecule; and a zirconium metal salt expressed by Formula (I). A sealed optical semiconductor is formed by sealing a LED chip by applying the heat-curable silicone resin composition to the LED chip, heating the LED chip, and curing the heat-curable silicone resin composition.

(I)

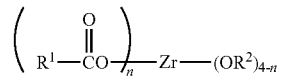

12 Claims, 7 Drawing Sheets

SILANOL CONDENSATION CATALYST, HEAT-CURABLE SILICONE RESIN COMPOSITION FOR SEALING PHOTOSEMICONDUCTORS AND SEALED PHOTOSEMICONDUCTOR USING SAME

CROSS-REFERENCE TO RELATED APPLICATIONS

This U.S. National stage application claims priority under 35 U.S.C. §119(a) to Japanese Patent Application No. 2008-319494, filed in Japan on Dec. 16, 2008, and to Japanese Patent Application No. 2009-259129, filed in Japan on Nov. 12, 2009, the entire contents of Japanese Patent Application No. 2008-319494 and Japanese Patent Application No. 2009-259129 are hereby incorporated herein by reference.

BACKGROUND

1. Field of the Invention

The present invention relates to a silanol condensation catalyst, a heat-curable silicone resin composition for sealing optical semiconductors, and a sealed optical semiconductor using the same.

2. Background Information

Conventionally, epoxy resins have been proposed as resins for use in compositions for sealing optical semiconductors as described, for example, in Japanese Unexamined Patent Application Publication No. H10-228249A. However, there is a problem in that a color of seals formed form compositions including epoxy resin yellow due to heat emitted from white LED elements.

Additionally, organopolysiloxane compositions that cure at room temperature including an organopolysiloxane containing two silanol groups, a silane compound containing two or more hydrolyzable groups in the molecule that are bonded to a silicon atom, and an organic zirconium compound have been proposed as described in Japanese Unexamined Patent Application Publication No. 2001-200161A and Japanese Unexamined Patent Application Publication No. H02-196860A.

Moreover, mixing a condensation catalyst with a diorganopolysiloxane containing two silanol groups and a silane containing three or more alkoxy groups, and then heating the mixture has been proposed as described in Japanese Unexamined Patent Application Publication No. 2007-224089A and Japanese Unexamined Patent Application Publication No. 2006-206700A.

SUMMARY OF THE INVENTION

However, the present inventors discovered that there is room for improvement of a loss on heat of the obtained cured product when curing a compound including an organopolysiloxane containing two silanol groups, a silane compound containing two or more hydrolyzable groups in the molecule that are bonded to a silicon atom, and a catalyst such an organic zirconium compound.

Furthermore, the present inventors discovered that curing is inferior when a compound including an organopolysiloxane containing two silanol groups, a silane compound containing two or more hydrolyzable groups in the molecule that are bonded to a silicon atom, and a catalyst (e.g. a zirconium chelate complex or a zirconium tetra alcoholate) is applied and formed into a thin film (e.g. not more than 0.3 mm).

Additionally, the present inventors discovered that curing is inferior and heat resistance (e.g. loss on heat) is inferior due to the use of a large amount of a catalyst when heat-curing a compound including an organopolysiloxane containing two silanol groups, a silane compound containing two or more hydrolyzable groups in the molecule that are bonded to a silicon atom, and a zirconium chelate complex, or the like.

Additionally, the present inventors discovered that while loss on heat can be suppressed, curing is inferior when a composition including zirconium naphthenate as a catalyst is applied and formed into a thin film (e.g. not more than 0.3 mm).

Thus, an object of the present invention is to provide a heat-curable silicone resin composition for sealing optical semiconductors with superior heat resistant coloration stability and thin film curability, and by which loss on heat can be suppressed.

As a result of diligent research into a solution for the problems described above, the present inventors discovered that a heat-curable silicone resin composition for sealing optical semiconductors including 100 parts by mass of a polysiloxane containing two or more silanol groups in the molecule; from 0.1 to 2,000 parts by mass of a silane compound containing two or more alkoxy groups that are bonded to a silicon atom in the molecule; and a zirconium metal salt expressed by a specific formula could be formed having superior heat resistant coloration stability and thin film curability and whereby loss on heat could be suppressed. Thus, they arrived at the present invention.

Additionally, the present inventors discovered that a silanol condensation catalyst including at least a zirconium metal salt expressed by Formula (I) below could provide a heat-curable silicone resin composition for sealing optical semiconductors having superior heat resistant coloration stability and thin film curability and whereby loss on heat is suppressed. Thus, they arrived at the present invention.

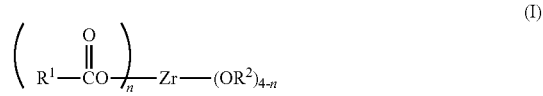

In Formula (I), n is an integer from 1 to 3; each $R^1$ is a hydrocarbon group having from 1 to 16 carbons; and each $R^2$ is a hydrocarbon group having from 1 to 18 carbons.

Specifically, the present invention provides the following 1 to 11.

1. A heat-curable silicone resin composition for sealing optical semiconductors including: (A) 100 parts by mass of a polysiloxane containing two or more silanol groups in the molecule; (B) from 0.1 to 2,000 parts by mass of a silane compound containing two or more alkoxy groups that are bonded to a silicon atom in the molecule; and (C) a zirconium metal salt expressed by Formula (I).

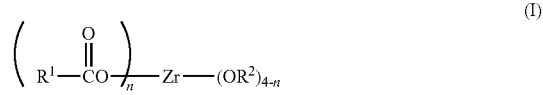

In Formula (I), n is an integer from 1 to 3; each $R^1$ is a hydrocarbon group having from 1 to 16 carbons; and each $R^2$ is a hydrocarbon group having from 1 to 18 carbons.

2. The heat-curable silicone resin composition for sealing optical semiconductors described in 1, wherein the $R^1$ of Formula (I) is at least one selected from the group consisting of a cyclopropyl group, a cyclopentyl group, a cyclohexyl group, an adamanthyl group, and a naphthene ring.

3. The heat-curable silicone resin composition for sealing optical semiconductors described in 1 or 2, further including from 0.001 to 5 parts by mass of a quaternary tin compound containing an alkyl group and an acyl group per a total 100 parts by mass of the polysiloxane and the silane compound.

4. The heat-curable silicone resin composition for sealing optical semiconductors described in any of 1 to 3, wherein a content of the zirconium metal salt is from 0.001 to 5 parts by mass per the total 100 parts by mass of the polysiloxane and the silane compound.

5. The heat-curable silicone resin composition for sealing optical semiconductors described in any of 1 to 4, including a straight chain organopolydimethylsiloxane having a weight-average molecular weight of from 1,000 to 1,000,000 expressed by Formula (1) below as the polysiloxane.

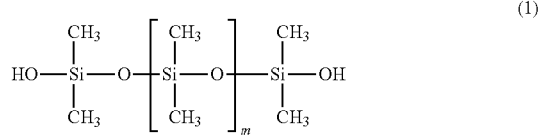

(1)

6. The heat-curable silicone resin composition for sealing optical semiconductors described in any of 1 to 5, further including from 0.1 to 5 parts by mass of bis(alkoxysilyl)alkane per the total 100 parts by mass of the polysiloxane and the silane compound.

7. A sealed optical semiconductor formed by sealing a LED chip by: applying a heat-curable silicone resin composition for sealing optical semiconductors described in any of 1 to 6 to the LED chip, heating the LED chip, and curing the heat-curable silicone resin composition for sealing optical semiconductors.

8. A silanol condensation catalyst including at least a zirconium metal salt expressed by Formula (I) below.

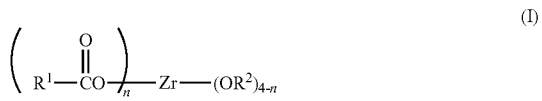

(I)

In Formula (I), n is an integer from 1 to 3; each $R^1$ is a hydrocarbon group having from 1 to 16 carbons; and each $R^2$ is a hydrocarbon group having from 1 to 18 carbons.

9. The silanol condensation catalyst described in 8, further including a quaternary tin compound, wherein
a content of the quaternary tin compound is not less than 0.1 moles and less than 4 moles per 1 mole of the zirconium metal salt.

10. The silanol condensation catalyst described in 8 or 9, wherein the $R^1$ has a ring structure.

11. The silanol condensation catalyst described in any of 8 to 10, wherein the $R^1$ is at least one selected from the group consisting of a cyclopropyl group, a cyclopentyl group, a cyclohexyl group, an adamanthyl group, and a naphthene ring.

The heat-curable silicone resin composition for sealing optical semiconductors of the present invention has superior heat resistant coloration stability and thin film curability, and can suppress loss on heat.

The sealed optical semiconductor of the present invention has superior heat resistant coloration stability and thin film curability and can suppress loss on heat.

The silanol condensation catalyst of the present invention can provide a heat-curable silicone resin composition for sealing optical semiconductors that has superior heat resistant coloration stability and thin film curability and that suppresses loss on heat.

DETAILED DESCRIPTION

Figure 1:
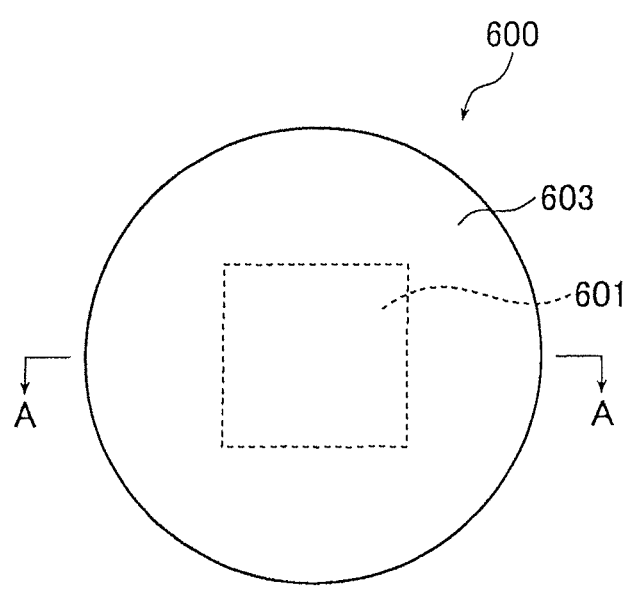
FIG. 1 is a top view schematically illustrating an example of a sealed optical semiconductor of the present invention.

The present invention is described in detail below.

A description of a silanol condensation catalyst of the present invention is given below.

The silanol condensation catalyst of the present invention is a catalyst including at least a zirconium metal salt expressed by Formula (I) below.

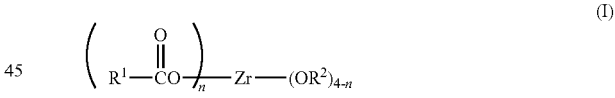

(I)

In Formula (I), n is an integer from 1 to 3; each $R^1$ is a hydrocarbon group having from 1 to 16 carbons; and each $R^2$ is a hydrocarbon group having from 1 to 18 carbons.

In Formula (I), when n is 2 or greater, the plurality of $R^1$ may be the same or different. Additionally, when n is 1 or 2, the plurality of $R^2$ may be the same or different.

The zirconium metal salt included in the silanol condensation catalyst of the present invention is not prone to moisture curing (i.e. has low activity with respect to moisture). On this point, the present inventors consider a reaction mechanism of the zirconium metal salt included in the silanol condensation catalyst of the present invention to be different than that of a tin compound that is moisture curable.

In contrast, the zirconium metal salt included in the silanol condensation catalyst of the present invention can be activated by heating and condensed by a silanol group (e.g. by a reaction between silanol groups or between a silanol group and an alkoxysilyl group). Thereby, by heating, the zirconium metal salt can thoroughly and uniformly cure a composition including at least a silanol group.

Thus, the silanol condensation catalyst of the present invention is a heat initiated silanol condensation catalyst having superior curability (e.g. thin film curability) with a small amount of a catalyst, and superior heat resistance (e.g. the suppression of loss on heat). Additionally, the heat-curable silicone resin composition for sealing optical semiconductors in which the silanol condensation catalyst of the present invention is included has superior curability (e.g. thin film curability), heat resistance (e.g. suppression of loss on heat), and heat resistant coloration stability even when only a small amount of the silanol condensation catalyst of the present invention is used.

In the zirconium metal salt expressed by Formula (I) included in the silanol condensation catalyst of the present invention, the hydrocarbon group used as $R^1$ has from 1 to 16 carbons. From the perspectives of obtaining superior heat resistant coloration stability, thin film curability, and compatibility (e.g. compatibility with silicone resin), $R^1$ preferably has from 3 to 16 carbons and more preferably from 4 to 16 carbons.

Examples of the hydrocarbon group of $R^1$ include aliphatic hydrocarbon groups, cycloaliphatic hydrocarbon groups, aromatic hydrocarbon groups, and combinations thereof. The hydrocarbon group may be straight or branched. The hydrocarbon group can contain an unsaturated bond. The hydrocarbon group can contain a hetero atom such as, for example, an oxygen atom, a nitrogen atom, and a sulfur atom. From the perspectives of obtaining superior heat resistant coloration stability, thin film curability, and compatibility, the hydrocarbon group of $R^1$ is preferably a cycloaliphatic hydrocarbon group or an aliphatic hydrocarbon group.

From the perspectives of obtaining superior heat resistant coloration stability, thin film curability and compatibility, $R^1$ preferably has a ring structure.

Examples of the ring structure that $R^1$ can have include cycloaliphatic hydrocarbon groups, aromatic hydrocarbon groups, and combinations thereof. In addition to a ring structure, $R^1$ can have, for example, an aliphatic hydrocarbon group.

Examples of the cycloaliphatic hydrocarbon group include cycloalkyl groups such as a cyclopropyl group, a cyclobutyl group, a cyclopentyl group, a cyclohexyl group, a cycloheptyl group, and a cyclooctyl group; a naphthene ring (a cycloparaffin ring derived from naphthenic acid); and fused ring hydrocarbon groups such as an adamanthyl group and a norbornyl group.

Examples of the aromatic hydrocarbon group include phenyl groups, naphthyl groups, and azulene.

Examples of the aliphatic hydrocarbon group include methyl groups, ethyl groups, propyl groups, isopropyl groups, butyl groups, isobutyl groups, pentyl groups, hexyl group, octyl groups, 2-ethylhexyl groups, nonyl groups, decyl group, and undecyl groups.

Among these, from the perspectives of obtaining superior heat resistant coloration stability, thin film curability, and compatibility, cycloaliphatic hydrocarbon groups and aromatic hydrocarbon groups are preferable; cyclopropyl groups, cyclopentyl groups, cyclohexyl groups, adamanthyl groups, naphthene rings, ($R^1$ COO— as the naftate group), and phenyl groups are more preferable; and cyclopropyl groups, cyclopentyl groups, cyclohexyl groups, adamanthyl groups, and naphthene rings, are even more preferable.

Examples of the $R^1$COO— having the cycloaliphatic hydrocarbon group include cycloalkylcarbonyloxy groups such as cyclopropylcarbonyloxy groups, cyclobutylcarbonyloxy groups, cyclopentylcarbonyloxy groups, cyclohexylcarbonyloxy groups (cyclohexylcarbonate groups), cycloheptylcarbonyloxy groups (cycloheptylcarbonate groups), and cyclooctylcycloheptylcarbonyloxy groups; naftate groups (naphthenic acid esters); and carbonyloxy groups of fused ring hydrocarbon groups such as adamanthylcarbonyloxy groups and norbornylcarbonyloxy groups.

Examples of the $R^1$COO— having the aromatic hydrocarbon group include phenylcarbonyloxy groups, naphthylcarbonyloxy groups, and azulylcarboxy groups.

Examples of the $R^1$COO— having the aliphatic hydrocarbon group include acetates, propionates, butyrates, isobutyrates, octyllic acid ester, 2-ethylhexanoic acid ester, nonanoic acid ester, and lauric acid ester.

Among these, from the perspectives of obtaining superior heat resistant coloration stability, thin film curability, and compatibility, the $R^1$COO— having the cycloaliphatic hydrocarbon group, the $R^1$COO— having the aromatic hydrocarbon group, and 2-ethylhexanoate are preferable; cyclopropylcarbonyloxy groups, cyclopentylcarbonyloxy groups, cyclohexylcarbonyloxy groups, adamanthylcarbonyloxy groups, naftate groups, and phenylcarbonyloxy groups are more preferable; and cyclopropylcarbonyloxy groups, cyclopentylcarbonyloxy groups, cyclohexylcarbonyloxy groups, adamanthylcarbonyloxy groups, and naftate groups are even more preferable.

In the present invention, the hydrocarbon group used as $R^2$ has from 1 to 18 carbons. From the perspectives of obtaining superior heat resistant coloration stability, thin film curability, and compatibility, $R^2$ preferably has from 3 to 8 carbons.

Examples of the hydrocarbon group of $R^2$ include aliphatic hydrocarbon groups, cycloaliphatic hydrocarbon groups, aromatic hydrocarbon groups, and combinations thereof. The hydrocarbon group may be straight or branched. The hydrocarbon group can contain an unsaturated bond. The hydrocarbon group can contain a hetero atom such as, for example, an oxygen atom, a nitrogen atom, and a sulfur atom. From the perspectives of obtaining superior heat resistant coloration stability, thin film curability, and compatibility, the hydrocarbon group of $R^2$ is preferably an aliphatic hydrocarbon group.

Examples of the $R^{20}$— having the aliphatic hydrocarbon group (alkoxy group) include methoxy groups, ethoxy groups, propoxy groups (n-propoxy groups and isopropoxy groups), butoxy groups, pentyloxy groups, hexyloxy groups, and octyloxy groups.

Among these, from the perspectives of obtaining superior heat resistant coloration stability, thin film curability, and compatibility, methoxy groups, ethoxy groups, propoxy groups (n-propoxy groups and isopropoxy groups), butoxy groups, and pentyloxy groups are preferable.

Examples of the zirconium metal salt having the cycloaliphatic hydrocarbon group as the ring structure include:

zirconium alkoxy cyclopropane carboxylates such as zirconium trialkoxy monocyclopropane carboxylate, zirconium dialkoxy dicyclopropane carboxylate, and zirconium monoalkoxy tricyclopropane carboxylate;

zirconium alkoxy cyclopentane carboxylates such as zirconium trialkoxy monocyclopentane carboxylate, zirconium dialkoxy dicyclopentane carboxylate, and zirconium monoalkoxy tricyclopentane carboxylate;

zirconium alkoxy cyclohexane carboxylates such as zirconium tributoxy monocyclohexane carboxylate, zirconium dibutoxy dicyclohexane carboxylate, zirconium monobutoxy tricyclohexane carboxylate, zirconium tripropoxy monocyclo hexane carboxylate, zirconium dipropoxy dicyclohexane carboxylate, and zirconium monopropoxy tricyclohexane carboxylate;

zirconium alkoxy adamantane carboxylates such as zirconium trialkoxy monoadamantane carboxylate, zirconium dialkoxy diadamantane carboxylate, and zirconium monoalkoxy triadamantane carboxylate; and zirconium alkoxy naftates such as zirconium tributoxy mononaftate, zirconium dibutoxy dinaftate, zirconium monobutoxy trinaftate, zirconium tripropoxy mononaftate, zirconium dipropoxy dinaftate, and zirconium monopropoxy trinaftate.

Examples of the zirconium metal salt having the aromatic hydrocarbon group as the ring structure include zirconium alkoxy benzene carboxylates such as zirconium tributoxy monobenzene carboxylate, zirconium dibutoxy dibenzene carboxylate, zirconium monobutoxy tribenzene carboxylate, zirconium tripropoxy monobenzene carboxylate, zirconium dipropoxy dibenzene carboxylate, and zirconium monopropoxy tribenzene carboxylate.

Examples of the zirconium metal salt having the aliphatic hydrocarbon group include:

zirconium alkoxybutyrates such as zirconium tributoxy monoisobutyrate, zirconium dibutoxy diisobutyrate, zirconium monobutoxy triisobutyrate, zirconium tripropoxy monoisobutyrate, zirconium dipropoxy diisobutyrate, and zirconium monopropoxy triisobutyrate;

zirconium alkoxy 2-ethylhexanoates such as zirconium tributoxy mono(2-ethylhexanoate), zirconium dibutoxy di(2-ethylhexanoate), zirconium monobutoxy tri(2-ethylhexanoate), zirconium tripropoxy mono(2-ethylhexanoate), zirconium dipropoxy di(2-ethylhexanoate), and zirconium monopropoxy tri(2-ethylhexanoate); and zirconium alkoxy neodecanates such as zirconium tributoxy mononeodecanate, zirconium dibutoxy dineodecanate, zirconium monobutoxy trineodecanate, zirconium tripropoxy mononeodecanate, zirconium dipropoxy dineodecanate, and zirconium monopropoxy trineodecanate.

Among these, from the perspectives of obtaining superior heat resistant coloration stability, thin film curability, and compatibility, and being able to suppress loss on heat the zirconium metal salt having the cycloaliphatic hydrocarbon group as the ring structure and the zirconium metal salt having the aromatic hydrocarbon group as the ring structure are preferable. For the same reasons, zirconium trialkoxy mononaftate, zirconium trialkoxy monoisobutyrate, zirconium trialkoxy mono(2-ethylhexanoate), zirconium trialkoxy monocyclopropane carboxylate, zirconium trialkoxy cyclobutane carboxylate, zirconium trialkoxy monocyclopentane carboxylate, zirconium trialkoxy monocyclohexane carboxylate, zirconium trialkoxy monoadamantane carboxylate, zirconium trialkoxy monobenzene carboxylate, and zirconium dialkoxy dinaftate are preferable; and zirconium tributoxy mononaftate, zirconium tributoxy monoisobutyrate, zirconium tributoxy mono(2-ethylhexanoate), zirconium tributoxy monocyclopropane carboxylate, zirconium tributoxy monocyclopentane carboxylate, zirconium tributoxy monocyclohexane carboxylate, zirconium trialkoxy monobenzene carboxylate, zirconium tributoxy monoadamantane carboxylate, zirconium dibutoxy dinaftate, and zirconium tripropoxy mononaftate are more preferable.

From the perspectives of obtaining superior heat resistant coloration stability and thin film curability, and being able to suppress loss on heat, the zirconium metal salt is preferable an alkoxy group-containing zirconium metal salt having from 1 to 3 acyl groups (ester bonds).

Examples of the alkoxy group-containing zirconium metal salt having from 1 to 3 acyl groups include zirconium tributoxy mononaftate, zirconium tributoxy monoisobutyrate, zirconium tributoxy mono(2-ethylhexanoate), zirconium tributoxy mononeodecanate, zirconium dibutoxy dinaftate, zirconium dibutoxy diisobutyrate, zirconium dibutoxy di(2-ethylhexanoate), zirconium dibutoxy dineodecanate, zirconium monobutoxy trinaftate, zirconium monobutoxy triisobutyrate, zirconium monobutoxy tri(2-ethylhexanoate), and zirconium monobutoxy trineodecanate.

Among these, from the perspectives of obtaining superior heat resistant coloration stability, thin film curability, and compatibility, and being able to suppress loss on heat, zirconium tributoxy mononaftate, zirconium tributoxy monoisobutyrate, and zirconium tributoxy mono(2-ethylhexanoate) are preferable.

A single zirconium metal salt can be used or a combination of two or more zirconium metal salts can be used.

Examples of a method for producing the zirconium metal salt include mixing not less than 1 mole and less than 4 moles of the carboxylic acid expressed by $R^1$—COOH [each $R^1$ is a hydrocarbon group having from 1 to 16 carbons; $R^1$ is synonymous with $R^1$ of Formula (I)] per 1 mole of $Zr(OR^2)_4$ [zirconium tetraalkoxide; each $R^2$ is a hydrocarbon group having from 1 to 18 carbons; $R^2$ is synonymous with $R^2$ of Formula (I)] in a nitrogen atmosphere at from 20 to 80° C.

Additionally, D.C. Bradley, "Metal alkoxide", Academic Press, 1978 can be referenced for information about the reaction between Zr alcoholate and carboxylic acid.

Examples of the $Zr(OR^2)_4$ that can be used in the production of the zirconium metal salt include zirconium tetramethoxide, zirconium tetraethoxide, zirconium tetranormalpropoxide, zirconium tetrapropoxide, and zirconium tetranormalbutoxide.

Examples of the carboxylic acid that can be used in the production of the zirconium metal salt include aliphatic carboxylic acids such as acetic acid, propionic acid, isobutyric acid, octyllic acid, 2-ethylhexanoic acid, nonanoic acid, and lauric acid; cycloaliphatic carboxylic acids such as naphthenic acid, cyclopropane carboxylic acid, cyclopentane carboxylic acid, cyclohexyl carboxylic acid (cyclohexane carboxylic acid), adamantane carboxylic acid, and norbornane carboxylic acid; and aromatic carboxylic acids such as benzoic acid.

The silanol condensation catalyst of the present invention may further include a tin compound.

From the perspectives of obtaining superior heat resistant coloration stability and thin film curability, and being able to suppress loss on heat, the silanol condensation catalyst of the present invention preferably further includes the tin compound.

From the perspectives of obtaining superior heat resistant coloration stability and thin film curability, and being able to suppress loss on heat, the tin compound further included in the silanol condensation catalyst of the present invention is preferably a quaternary tin compound.

The quaternary tin compound is preferably a quaternary tin compound including at least one alkyl group and at least one acyl group.

In the present invention, the tin compound can include an acyl group as an ester bond.

Examples of the quaternary tin compound is preferably a quaternary tin compound including at least one alkyl group and at least one acyl group include a product expressed by Formula (II), and a bis-type product and a polymer-type product expressed by Formula (II).

$$R^3_a\text{—Sn—}[O\text{—}CO\text{—}R^4]_{4-a} \qquad (II)$$

In Formula (II), $R^3$ is an alkyl group; $R^4$ is a hydrocarbon group; and a is an integer from 1 to 3.

Examples of the alkyl group include alkyl groups with 1 or more carbons, specifically, methyl groups, ethyl groups, propyl groups, butyl groups, pentyl groups, and octyl groups.

The hydrocarbon group is not particularly limited. Examples thereof include aliphatic hydrocarbon groups such as methyl groups and ethyl groups, cycloaliphatic hydrocarbon groups, aromatic hydrocarbon groups, and combinations thereof. The hydrocarbon group may be straight or branched. The hydrocarbon group can contain an unsaturated bond. The hydrocarbon group can contain a hetero atom such as, for example, an oxygen atom, a nitrogen atom, and a sulfur atom.

Examples of the bis-type product expressed by Formula (II) include products expressed by Formula (III) below.

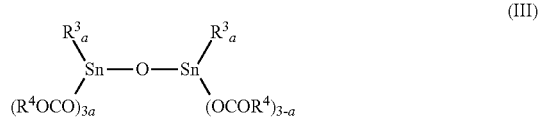

In Formula (III), $R^3$ and $R^4$ are synonymous with Formula (II), and a is 1 or 2.

Examples of the tin compound include, dialkyltin compounds such as dibutyltin diacetate, dibutyltin dioctate, dibutyltin dilaurate, dioctyltin diacetate, and dioctyltin maleate (product expressed by Formula (II) above where a=2); dimeric dialkyltins such as dibutyltin oxyacetate dibutyltin oxyoctylate, dibutyltin oxylaurate dibutyltin bismethylmalate, and dibutyltin oxyoleate; or dibutyltin malate polymers and dioctyltin malate polymers; and monobutyltin tris (2-ethylhexanoate) (product expressed by Formula (II) above where a=1).

Among these, from the perspectives of obtaining superior heat resistant coloration stability and thin film curability, dibutyltin diacetate, dibutyltin dioleate, dibutyltin dilaurate, dibutyltin oxyacetate dibutyltin oxyoctylate, and dibutyltin oxylaurate are preferable.

A single tin compound can be used or a combination of two or more tin compounds can be used. Production of the tin compound is not particularly limited. Examples thereof include conventionally known methods.

From the perspectives of obtaining superior heat resistant coloration stability and thin film curability, and being able to suppress loss on heat, a content of the tin compound is preferably not less than 0.1 mole and less than 4 moles and more preferably from 0.5 to 1.5 moles per 1 mole of the zirconium metal salt.

The silanol condensation catalyst of the present invention can further include additives in addition to the zirconium metal salt and the tin compound that can be used as necessary. Examples of the additives include adhesion promoters such as bis(alkoxysilyl)alkane and coupling agents, fillers, phosphors, and other additives that the composition of the present invention can include.

Production of the silanol condensation catalyst of the present invention is not particularly limited.

For example, when the silanol condensation catalyst of the present invention is made exclusively from the zirconium metal salt, the zirconium metal salt may be used as the silanol condensation catalyst.

When the silanol condensation catalyst of the present invention further includes the tin compound, the silanol condensation catalyst can be produced by mixing the zirconium metal salt and the tin compound.

Additionally, when the silanol condensation catalyst of the present invention further includes the tin compound, the zirconium metal salt and the tin compound may be prepared and used separately.

The silanol condensation catalyst of the present invention can be used as a catalyst for causing condensation at a silanol group in a compound containing at least a silanol group (e.g. a hydrocarbon-based polymer containing a silanol group, or a polysiloxane containing a silanol group). Examples of the condensation of the compound containing a silanol group include condensation of a compound containing a silanol group and another compound containing a silanol group, and condensation of a compound containing a silanol group and a compound containing an alkoxy group or an alkoxysilyl group.

Examples of compositions including the compound containing at least a silanol group to which the silanol condensation catalyst of the present invention can be applied include compounds including: (A) a polysiloxane containing two or more silanol groups in the molecule, and (B) a silane compound containing two or more alkoxy groups that are bonded to a silicon atom in the molecule.

Examples of the compound containing the silanol groups included in the composition to which the silanol condensation catalyst of the present invention can be applied include: (A) a polysiloxane containing two or more silanol groups in the molecule that is included in the heat-curable silicone resin composition for sealing optical semiconductors of the present invention.

Examples of the compound containing an alkoxy group or an alkoxysilyl group included in the composition to which the silanol condensation catalyst of the present invention can be applied include: (B) a silane compound containing two or more alkoxy groups that are bonded to a silicon atom in the molecule included in the heat-curable silicone resin composition for sealing optical semiconductors of the present invention, or an alkoxy oligomer wherein the silane compound is partially hydrolyzed.

From the perspectives of obtaining superior heat resistant coloration stability and thin film curability, and being able to suppress loss on heat, a content of the zirconium metal salt is preferably from 0.001 to 5 parts by mass, more preferably from 0.001 to 0.5 parts by mass, and even more preferably from 0.01 to 0.1 parts by mass per a total 100 parts by mass of the polysiloxane and the silane compound.

Because the silanol condensation catalyst of the present invention includes the zirconium metal salt, adhesion to silanol-based compounds will be superior and loss on heat can be suppressed to a minimal amount.

From the perspectives of obtaining superior heat resistant coloration stability and thin film curability, and being able to suppress loss on heat, a content of the tin compound is preferably from 0.001 to 5 parts by mass and more preferably from 0.01 to 0.1 parts by mass per the total 100 parts by mass of the polysiloxane and the silane compound.

Examples of compositions including the silanol condensation catalyst of the present invention include:

a heat-curable silicone resin composition for sealing optical semiconductors including:

(A) 100 parts by mass of a polysiloxane containing two or more silanol groups in the molecule;

(B) from 0.1 to 2,000 parts by mass of a silane compound containing two or more alkoxy groups that are bonded to a silicon atom in the molecule; and (D) the silanol condensation catalyst of the present invention.

The polysiloxane and the silane compound are synonymous with the constituents included in the heat-curable silicone resin composition for sealing optical semiconductors of the present invention described below.

The zirconium metal salt included in the silanol condensation catalyst of the present invention corresponds with the zirconium metal salt included in the heat-curable silicone resin composition for sealing optical semiconductors of the present invention described below.

Additionally, the tin compound further included in the silanol condensation catalyst of the present invention corresponds with the tin compound included in the heat-curable silicone resin composition for sealing optical semiconductors of the present invention described below.

A description of the heat-curable silicone resin composition for sealing optical semiconductors of the present invention is given below.

The heat-curable silicone resin composition for sealing optical semiconductors of the present invention includes:

(A) 100 parts by mass of a polysiloxane containing two or more silanol groups in the molecule;

(B) from 0.1 to 2,000 parts by mass of a silane compound containing two or more alkoxy groups that are bonded to a silicon atom in the molecule; and (C) a zirconium metal salt expressed by Formula (I):

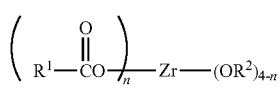

In Formula (I), n is an integer from 1 to 3; each $R^1$ is a hydrocarbon group having from 1 to 16 carbons; and each $R^2$ is a hydrocarbon group having from 1 to 18 carbons.

Note that the heat-curable silicone resin composition for sealing optical semiconductors of the present invention is also referred to herein as the "composition of the present invention".

A description of the (A) polysiloxane is given below.

The polysiloxane included in the composition of the present invention has two or more silanol groups in the molecule.

An example of a preferable form of the polysiloxane is an organopolysiloxane.

The hydrocarbon group included in the organopolysiloxane is not particularly limited. Examples thereof include aromatic groups such as phenyl groups, alkyl groups, and alkynyl groups.

The backbone of the polysiloxane may be straight or branched.

Examples of the polysiloxane include organopolydialkylsiloxanes wherein two or more silanol groups are bonded at an end.

From the perspectives of obtaining superior heat resistant coloration stability, thin film curability, and reducing loss on heat, the polysiloxane is preferably an organopolydimethylsiloxane wherein two silanol groups are bonded at an end, and more preferably a straight chain organopolydimethylsiloxane wherein two silanol groups are bonded at an end (straight chain organopolydimethylsiloxane-α,ω-diol).

Examples of the polysiloxane include products expressed by Formula (1) below.

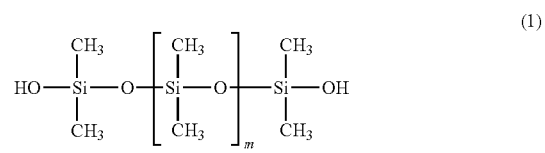

In Formula (1), m can be set to a numerical value that corresponds to a weight-average molecular weight of the polysiloxane. From the perspectives of obtaining superior workability and cracking resistance, m is preferably an integer from 10 to 15,000.

Production of the polysiloxane is not particularly limited. Examples thereof include conventionally known methods.

From the perspectives of obtaining superior heat resistant coloration stability, thin film curability; superior curability resulting from suitable lengths of curing time and workable life; and superior curing physical properties, a molecular weight of the polysiloxane is preferably from 1,000 to 1,000,000 and more preferably from 6,000 to 100,000.

Note that in the present invention, the molecular weight of the polysiloxane is a weight-average molecular weight indicated by the molecular weight of polystyrene, determined by Gel Permeation Chromatography (GPC) using chloroform as the solvent.

A single polysiloxane can be used or a combination of two or more polysiloxanes can be used.

A description of (B) the silane compound is given below.

The silane compound included in the composition of the present invention is not particularly limited so long as it is a compound having two or more alkoxy groups that are bonded to a silicon atom in the molecule.

Examples thereof include compounds having one silicon atom in the molecule and wherein two or more alkoxy groups are bonded to the silicon atom (hereinafter, this compound is also referred to as "silane compound B1"); and an organopolysiloxane compound having two or more silicon atoms in the molecule, a polysiloxane skeleton, and wherein two or more alkoxy groups are bonded to the silicon atom (hereinafter, this organopolysiloxane compound is also referred to as "silane compound B2").

The silane compound can include one or more organic groups in the molecule.

Examples of the organic group that can be included in the silane compound include hydrocarbon groups that may include at least one selected from the group consisting of an oxygen atom, a nitrogen atom, and a sulfur atom. Specific examples include alkyl groups (preferably with 1 to 6 carbons), (meth)acrylate groups, alkynyl groups, aryl groups, and combinations thereof. Examples of the alkyl group include methyl groups, ethyl groups, propyl groups, isopropyl group, and the like. Examples of the alkynyl group include vinyl groups, allyl groups, propenyl groups, isopropenyl groups, 2-methyl-1-propenyl groups, and 2-methylallyl groups. Examples of the aryl group include phenyl groups and naphthyl groups. Among these, from the perspective of obtaining superior heat resistant coloration stability, methyl groups, (meth)acrylate groups, and (meth)acryloxyalkyl groups are preferable.

Examples of the silane compound B1 include products expressed by Formula (2) below.

In Formula (2), n is 2, 3, or 4; $R^1$ is an alkyl group; and $R^2$ is an organic group. The organic group is synonymous with the constituent described as the organic group of the silane compound.

Examples of the silane compound B1 include dialkoxysilanes such as dimethyldimethoxysilane, dimethyldiethoxysilane, diethyldimethoxysilane, diethyldiethoxysilane, diphenyldimethoxysilane, and diphenyldiethoxysilane; trialkoxysilanes such as methyltrimethoxysilane, methyltriethoxysilane, ethyltrimethoxysilane, ethyltriethoxysilane, phenylrimethoxysilane, and phenyltriethoxysilane; tetraalkoxysilanes such as tetramethoxysilane, tetraethoxysilane, and tetraisopropyloxysilane; hydrolysates such as trialkoxysilane and tetraalkoxysilane; and (meth)acryloxyalkyltrialkoxysilanes such as γ-(meth)acryloxypropyltrimethoxysilane and γ-(meth)acryloxypropyltriethoxysilane.

Note that in the present invention, "(meth)acryloxytrialkoxysilane" refers to either acryloxytrialkoxysilane or methacryloxytrialkoxysilane. The same is true for "(meth)acrylate group" and "(meth)acryloxyalkyl group".

Examples of the silane compound B2 include compounds expressed by Formula (3) below.

In Formula (3), R is an alkyl group, an alkynyl group, or an aryl group having from 1 to 6 carbons; R' is an alkyl group having from 1 to 6 carbons; m is such that 0.

Examples of the alkyl group having from 1 to 6 carbons include methyl groups, ethyl groups, isopropyl groups, and the like. Among these, from the perspective of obtaining superior heat resistance and heat resistant coloration stability, a methyl group is preferable. Examples of the alkynyl group include those having from 1 to 6 carbons, specifically, vinyl groups, allyl groups, propenyl groups, isopropenyl groups, 2-methyl-1-propenyl groups, and 2-methylallyl groups. Examples of the aryl group include phenyl groups and naphthyl groups.

The alkyl group having from 1 to 6 carbons (R') in the compound expressed by Formula (3) can, for example, include a hetero atom such as an oxygen atom. R' may, for example, be an acyl group. Examples of the acyl group include acetyl groups, propionyl groups, butyryl groups, isobutyryl groups, and valeryl groups.

Examples of the silane compound B2 include silicone alkoxy oligomers such as a methylmethoxy oligomer.

The silicone alkoxy oligomer is a silicone resin that has a polyorganosiloxane backbone, wherein the end of the molecule is closed by an alkoxy group.

The methylmethoxy oligomer corresponds with the compound expressed by Formula (3) and specific examples thereof include products expressed by Formula (4) below.

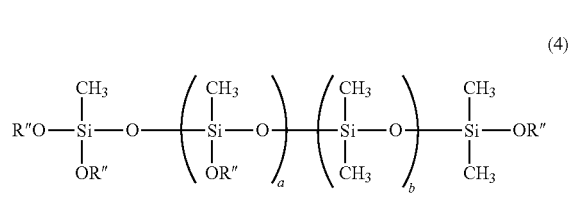

In Formula (4), R" is a methyl group; a is an integer from 1 to 100; and b is an integer from 0 to 100.

A commercially available product can be used as the methylmethoxy oligomer. Examples of the commercially available methylmethoxy oligomer include x-40-9246, manufactured by Shin-Etsu Chemical Co., Ltd. (weight-average molecular weight: 6,000).

An example of a preferable form of the silane compound B2 is a compound having an alkoxysilyl group on at least one end and three or more alkoxy groups (derived from alkoxysilyl groups) in the molecule (hereinafter, this compound is referred to as "silane compound B3"). The silane compound B3 can, for example, be obtained as a reactant of de-alcohol condensing one or more moles of a silane compound including an alkoxy group per one mole of a polysiloxane having silanol groups at both ends.

Examples of the silane compound including an alkoxy group used in the production of the silane compound B3 include compounds expressed by Formula (2) above: $Si(OR^1)_n R^2_{4-n}$; and compounds expressed by Formula (3) above: $R_m Si(OR')_n O_{(4-m-n)/2}$.

Examples of the polysiloxane having silanol groups on both ends used in the production of the silane compound B3 include the products expressed by Formula (1) above.

Examples of the silane compound B3 include products expressed by Formula (IV) below.

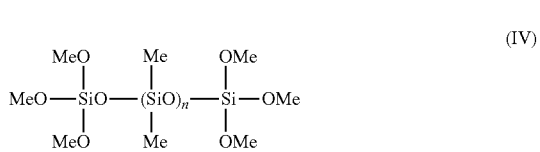

In Formula (IV), n is a numerical value that corresponds to a molecular weight of the silane compound.

The compound expressed by Formula (IV) can be produced, for example, by denaturing the polysiloxane having silanol groups at both ends using a tetramethoxysilane (corresponding with the silane compound expressed by Formula (2)).

From the perspectives of obtaining superior heat resistant coloration stability, thin film curability, and heat cracking resistance, the silane compound is preferably a compound expressed by Formula (2) or Formula (3).

From the perspectives of obtaining superior heat resistant coloration stability and thin film curability, the silane compound is preferably a tetraalkoxysilane such as tetraethoxysilane; a trialkoxy (meth)acryloxyalkylsilane such as γ-(meth)acryloxypropyltrimethoxysilane; or a methylmethoxy oligomer.

From the perspectives of obtaining superior heat resistant coloration stability, thin film curability; superior curability resulting from suitable lengths of curing time and workable life; and superior compatibility, the molecular weight of the silane compound is preferably from 100 to 1,000,000 and more preferably from 1,000 to 100,000.

Note that in the present invention, when the silane compound is the silane compound B2, the molecular weight thereof is a weight-average molecular weight indicated by the molecular weight of polystyrene, determined by gel permeation chromatography (GPC) using chloroform as the solvent.

Production of the silane compound is not particularly limited and examples thereof include conventionally known methods. A single silane compound can be used or a combination of two or more silane compounds can be used.

From the perspectives of obtaining superior heat resistant coloration stability, thin film curability, cracking resistance, and compatibility, a content of the silane compound is from 0.1 to 2,000 parts by mass, preferably from 0.1 to 1,000 parts by mass, more preferably from 0.1 to 100 parts by mass, and even more preferably from 0.5 to 50 parts by mass per 100 parts by mass of the polysiloxane. It is also possible to set the content of the silane compound to be 10 parts by mass or less.

A description of the zirconium metal salt is given below.

The zirconium metal salt included in the composition of the present invention is a compound expressed by Formula (I) below.

Note that in the present specification, the zirconium metal salt included in the composition of the present invention is synonymous with the zirconium metal salt included in the silanol condensation catalyst of the present invention.

As expressed by Formula (I) below, the zirconium metal salt has from 1 to 3 acyl groups ($R^1$—CO—). With the zirconium metal salt expressed in Formula (I), the acyl group is included in Formula (I) as a carboxylate ester.

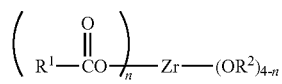

(I)

In Formula (I), n is an integer from 1 to 3; each $R^1$ is a hydrocarbon group having from 1 to 16 carbons; and each $R^2$ is a hydrocarbon group having from 1 to 18 carbons.

From the perspectives of obtaining superior heat resistant coloration stability and thin film curability, and being able to suppress loss on heat, a content of the zirconium metal salt is preferably from 0.001 to 5 parts by mass, more preferably from 0.001 to 0.5 parts by mass, and even more preferably from 0.01 to 0.1 parts by mass per a total 100 parts by mass of the polysiloxane and the silane compound.

It is thought that the zirconium metal salt acts as a Lewis-acid at initial heating for curing the composition and heating following initial curing, and promotes a cross-linking reaction between the polysiloxane and the silane compound.

Because the composition of the present invention includes the zirconium metal salt, adhesive strength is superior and loss on heat can be suppressed to a minimal amount.

The composition of the present invention may further include a tin compound.

From the perspectives of obtaining superior heat resistant coloration stability and thin film curability, and being able to suppress loss on heat, the composition of the present invention preferably further includes the tin compound.

Note that in the present specification, the tin compound included in the composition of the present invention is synonymous with the tin compound that can be further included in the silanol condensation catalyst of the present invention.

From the perspectives of obtaining superior heat resistant coloration stability and thin film curability, and being able to suppress loss on heat, a content of the tin compound is preferably from 0.001 to 5 parts by mass and more preferably from 0.01 to 0.1 parts by mass per the total 100 parts by mass of the polysiloxane and the silane compound.

From the perspectives of obtaining superior heat resistant coloration stability and thin film curability, and being able to suppress loss on heat, the composition of the present invention can be configured as a composition including the polysiloxane, the silane compound, the zirconium metal salt, and the tin compound (the composition including only the four constituents described above).

Additionally, the composition of the present invention can further include additives as necessary in addition to the polysiloxane, the silane compound, the zirconium metal salt, and the tin compound, so long as the object and the effectiveness of the present invention are not hindered.

Examples of the additives include fillers such as inorganic fillers, antioxidants, lubricants, UV absorbing agents, heat/light stabilizers, dispersing agents, antistatic agents, polymerization inhibitors, anti-foaming agents, curing accelerators, solvents, phosphors (e.g. inorganic phosphors), antiaging agents, radical inhibitors, adhesive strength enhancers, flame retardants, surfactants, storage stability enhancers, ozone antiaging agents, thickening agents, plasticizers, radiation blockers, nucleators, coupling agents, conductivity imparting agents, phosphorous-based peroxide decomposers, pigments, metal inactivators, physical property regulators, and adhesion imparting agents such as bis(alkoxysilyl)alkane and coupling agents. The additives are not particularly limited. Examples thereof include conventionally known products.

Examples of the bis(alkoxysilyl)alkane include products expressed by Formula (VII) below.

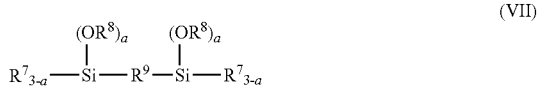

(VII)

In Formula (VII), $R^7$ and $R^8$ are each alkyl groups; $R^9$ is a divalent alkane that may include a heteroatom such as an oxygen atom, a nitrogen atom, or a sulfur atom; and each a is an integer from 1 to 3. Examples of the alkyl group include methyl groups and ethyl groups. The divalent alkane ($R^9$) is synonymous with the divalent alkane described above.

Examples of the bis(alkoxysilyl)alkane include 1,2-bis(triethoxysilyl)ethane, 1,4-bis(trimethoxysilyl)butane, 1-methyldimethoxysilyl-4-trimethoxysilylbutane, 1,4-bis(methyldimethoxysilyl)butane, 1,5-bis(trimethoxysilyl)pentane, 1,4-bis(trimethoxysilyl)pentane, 1-methyldimethoxysilyl-5-trimethoxysilylpentane, 1,5-bis(methyldimethoxysilyl)pentane, 1,6-bis(trimethoxysilyl)hexane, 1,4-bis(trimethoxysilyl)hexane, 1,5-bis(trimethoxysilyl)hexane, 2,5-bis(trimethoxysilyl)hexane, 1,6-bis(methyldimethoxysilyl)hexane, 1,7-bis(trimethoxysilyl)heptane, 2,5-bis(trimethoxysilyl)heptane, 2,6-bis(trimethoxysilyl)heptane, 1,8-bis(trimethoxysilyl)octane, 2,5-bis(trimethoxysilyl)octane, 2,7-bis(trimethoxysilyl)octane, 1,9-bis(trimethoxysilyl)nonane, 2,7-bis(trimethoxysilyl)nonane, 1,10-bis(trimethoxysilyl)decane, and 3,8-bis(trimethoxysilyl)decane; and products wherein a divalent alkane includes a nitrogen atom such as bis-(3-trimethoxysilylpropyl)amine.

From the perspectives of obtaining superior heat resistant coloration stability, thin film curability, curability in a closed system, adhesive strength, and heat resistant coloration stability; and having superior balance between transparency and adhesive strength, the bis(alkoxysilyl)alkane is preferably a product expressed by Formula (II); more preferably bis(trialkoxysilyl)alkane; even more preferably at least one selected from the group consisting of bis-(3-trimethoxysilylpropyl)amine, 1,2-bis(triethoxysilyl)ethane, 1,6-bis(trimethoxysilyl)hexane, 1,7-bis(trimethoxysilyl)heptane, 1,8-bis(trimethoxysilyl)octane, 1,9-bis(trimethoxysilyl)nonane, and 1,10-bis(trimethoxysilyl)decane; and yet further preferably 1,6-bis(trimethoxysilyl)hexane or bis-(3-trimethoxysilylpropyl)amine.

A single bis(alkoxysilyl)alkane can be used or a combination of two or more bis(alkoxysilyl)alkanes can be used.

From the perspectives of obtaining superior heat resistant coloration stability, thin film curability, curability in a closed system, adhesive strength, and heat resistant coloration stability; having superior balance between transparency and adhesive strength; and having superior moisture heat adhesion resistance, a content of the bis(alkoxysilyl)alkane is preferably from 0.1 to 5 parts by mass per the total 100 parts by mass of the polysiloxane and the silane compound.

Examples of the inorganic phosphors include yttrium, aluminum, and garnet-based YAG phosphors, ZnS phosphors, $Y_2O_2S$ phosphors, red light emitting phosphors, blue light emitting phosphors, and green light emitting phosphors that are used commonly in LEDs.

From the perspective of obtaining superior storage stability, an example of a preferable form of the composition of the present invention is one that is essentially free of water. The present invention being "essentially free of water" means that a content of water in the composition of the present invention is not more than 0.1 mass %.

Additionally, from the perspective of obtaining superior workplace ease of use, an example of a preferable form of the composition of the present invention is one that is essentially free of solvents. The present invention being "essentially free of solvents" means that a content of solvents in the composition of the present invention is not more than 1 mass %.

Production of the composition of the present invention is not particularly limited. For example, the composition of the present invention can be produced by mixing the polysiloxane, the silane compound, the zirconium metal salt, and the tin compound and the additives that can be added as necessary.

Note that when the heat-curable silicone resin composition for sealing optical semiconductors of the present invention further includes the tin compound, for example, in cases where the silanol condensation catalyst used in the composition of the present invention includes the zirconium metal salt and the tin compound, a method of producing the heat-curable silicone resin composition for sealing optical semiconductors of the present invention may be used wherein the silanol condensation catalyst is premixed with the zirconium metal salt and the tin compound and formed into a mixture or, alternately, the zirconium metal salt and the tin compound may be added to the system separately.

Additionally, from the perspectives of obtaining superior heat resistant coloration stability, thin film curability, and storage stability, and being able to suppress loss on heat, when the heat-curable silicone resin composition for sealing optical semiconductors of the present invention further includes the tin compound, the content of the tin compound (the content of the tin compound itself when the tin compound is used in the composition of the present invention; or a total content of the content of the tin compound in the silanol condensation catalyst and the content of the tin compound added separately when the zirconium metal salt and the tin compound are used as the silanol condensation catalyst in the composition of the present invention and a tin compound is further added separately to the composition, aside from as the silanol condensation catalyst) is preferably from 0.001 to 5 parts by mass and more preferably from 0.01 to 0.1 parts by mass per the total 100 parts by mass of the polysiloxane and the silane compound.

It is possible to produce the composition of the present invention as a one-component type composition or as a two-component type composition. An example of a preferable form when the composition of the present invention is produced as a two-component type composition is one that includes a first component including the polysiloxane, the zirconium metal salt, and the tin compound, and a second component including the silane compound. The additives can be added to the first component and/or the second component.

The composition of the present invention can be used as a composition for sealing an optical semiconductor.

The optical conductors to which the composition of the present invention can be applied are not particularly limited. Examples thereof include light emitting diodes (LED), organic electric field light emitting devices (organic EL), laser diodes, and LED arrays.

Examples of methods of use of the composition of the present invention include applying the composition of the present invention to an optical semiconductor, heating the optical semiconductor to which the composition of the present invention has been applied, and curing the composition of the present invention. The method for applying the composition of the present invention is not particularly limited. Examples thereof include methods using dispensers, potting processes, screen printing processes, transfer molding, and injection molding processes.

The composition of the present invention can be cured by heating.

From the perspectives of obtaining superior thin film curability; superior suppression of loss on heat; suitable lengths of curing time and workable life; being able to suppress foaming of the alcohol that is a by-product of condensation reactions; being able to suppress cracking in the cured product; and obtaining superior flatness, moldability, and physical properties of the molded product, curing is performed at a heating temperature preferably from about 80° C. to 150° C. and more preferably around 150° C.

From the perspectives of obtaining superior curability and transparency, the heating can be performed under essentially anhydrous conditions. In the present invention, performing the heating under "essentially anhydrous conditions" means that moisture in the air of the environment where the heating is performed is not more than 10% RH.

The cured product (silicone resin) obtained by heating and curing the composition of the present invention can maintain a high level of transparency over an extended period of time when used on an LED (particularly a white LED) has superior heat resistant coloration stability, thin film curability, adhesive strength, and heat cracking resistance, and has minimal loss on heat. The cross-linked portions and skeleton of the obtained cured product are all siloxane bonds. Therefore, the heat resistant coloration stability thereof is superior to that of conventional silicone resins.

The loss on heat of the present invention is a value calculated using an initially cured product obtained by heating and curing the composition of the present invention at 150° C. for 240 minutes, and a post-heating cured product obtained by further heating the initially cured product at 200° C. for 1,000 hours. Weights of both of the cured products are measured and the loss on heat is calculated by inserting the obtained weights in to the following equation.

$$\text{Loss on heat (mass \%)}=100-(\text{weight of post-heating cured product/weight of initially cured product})\times 100$$

When the value of the loss on heat is 20 mass % or less, loss on heat is being suppressed, and can be said to be practical as a heat-curable silicone resin composition for sealing optical semiconductors.

In the present invention, the initially cured product obtained by heating the heat-curable silicone resin composition for sealing optical semiconductors of the present invention is preferably heated at 200° C. for 1,000 hours, and the loss on heat of the post-heating (at 200° C.) cured product is preferably 20 mass % or less and more preferably from 0 to 10 mass %.

Transmission, measured at a wavelength of 400 nm, of the cured product obtained using the composition of the present invention (when a thickness of the cured product is 2 mm), when measured using an ultraviolet—visible absorption spectrophotometer (manufactured by Shimadzu Corporation, same to follow) in accordance with JIS K0115:2004 is preferably not less than 80% and more preferably not less than 85%.

Additionally, the cured product obtained using the composition of the present invention is subjected to a heat resistance test after the initial curing (wherein the cured product after initial curing is allowed to sit for 10 days at 150° C.). Transmission, measured at a wavelength of 400 nm, of the cured product obtained after the heat resistance test (thickness: 2 mm) when measured using an ultraviolet—visible absorption spectrophotometer in accordance with JIS K0115:2004 is preferably not less than 80% and more preferably not less than 85%.

A retention rate of the transmittance of the cured product obtained using the composition of the present invention (transmission after heat resistance test/transmission at initial curing×100) is preferably from 70 to 100% and more preferably from 80 to 100%.

In addition to optical semiconductors, the composition of the present invention can by used in applications such as, for example, display materials, optical recording media materials, optical device materials, optical part materials, optical fiber materials, optical electronic function organic materials, material around semiconductor integrated circuits, and the like.

Next, a description of the sealed optical semiconductor of the present invention is given below.

The sealed optical semiconductor of the present invention is a product formed by sealing a LED chip using the heat-curable silicone resin composition for sealing optical semiconductors of the present invention.

The sealed optical semiconductor can be formed by sealing a LED chip by: applying the heat-curable silicone resin composition for sealing optical semiconductors of the present invention to the LED chip, heating the LED chip, and curing the heat-curable silicone resin composition for sealing optical semiconductors.

A composition used in the sealed optical semiconductor of the present invention is not particularly limited so long as it is the heat-curable silicone resin composition for sealing optical semiconductors of the present invention.

Because the heat-curable silicone resin composition for sealing optical semiconductors of the present invention is used as the composition for the sealed optical semiconductor of the present invention, the sealed optical semiconductor of the present invention has superior heat resistant coloration stability with respect to heat and light emitted from the LED chip and superior thin film curability, and can suppress loss on heat caused by heat emitted from the LED chip or by heating in the manufacturing of the sealed optical semiconductor.

The LED chip used in the sealed optical semiconductor of the present invention is not particularly limited so long as it is an electric circuit having a light emitting diode as a light emitting device.

Color of the emitted light of the LED chip used in the sealed optical semiconductor of the present invention is not particularly limited. Examples thereof include white, blue, red, and green. From the perspectives of obtaining superior heat resistant coloration stability and being able to suppress loss on heat even when under conditions of exposure to heat emitted from the LED chip for extended periods of time, the sealed optical semiconductor of the present invention can be applied to a white LED.

The white LED is not particularly limited. Examples thereof include conventionally known products.

A size and a shape of the LED chip are not particularly limited. Additionally, a type of the LED chip is not particularly limited, and examples thereof include high-power LEDs, high-brightness LEDs, and general use brightness LEDs.

The sealed optical semiconductor of the present invention has at least one or more of the LED chip in a single sealed optical semiconductor, and can have two or more of the LED chips.

Examples of a method for manufacturing the sealed optical semiconductor of the present invention include a method including: a step of applying the heat-curable silicone resin composition for sealing optical semiconductors of the present invention to the LED chip; and a step of sealing the LED chip by heating the LED chip to which the heat-curable silicone resin composition for sealing optical semiconductors has been applied, and curing the heat-curable silicone resin composition for sealing optical semiconductors.

In the step of applying, the heat-curable silicone resin composition for sealing optical semiconductors is applied to the LED chip. Thus, an LED chip on which the heat-curable silicone resin composition for sealing optical semiconductors is applied is obtained. The LED chip used in the step of applying is synonymous with the LED chip described above. The composition used in the step of applying is not particularly limited so long as it is the heat-curable silicone resin composition for sealing optical semiconductors of the present invention. The method for applying is not particularly limited.

Next, in the step of heating and curing, the LED chip is cured by heating the LED chip to which the heat-curable silicone resin composition for sealing optical semiconductors is applied, and curing the heat-curable silicone resin composition for sealing optical semiconductors. Thus, the sealed optical semiconductor of the present invention can be obtained. The heating temperature used in the step of heating and curing is synonymous with that described above.

Examples of forms of the sealed optical semiconductor of the present invention include forms in which the cured product directly seals the LED chip, cannon ball forms, surface mounting forms, and forms wherein the cured product seals a portion between and/or a surface of a plurality of LED chips or sealed optical semiconductors.

Figure 2:
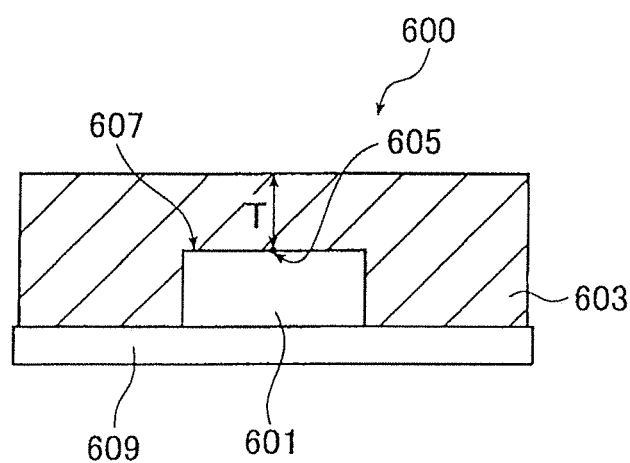
FIG. 2 is a cross-sectional view schematically illustrating a cross-section of the sealed optical semiconductor, taken along A-A depicted in FIG. 1.

A description of the sealed optical semiconductor of the present invention is given below while referencing the attached drawings. Note that the sealed optical semiconductor of the present invention is not limited to the attached drawings. FIG. 1 is a top view schematically illustrating an example of the sealed optical semiconductor of the present invention. FIG. 2 is a cross-sectional view schematically illustrating a cross-section of the sealed optical semiconductor, taken along A-A depicted in FIG. 1.

In FIG. 1, 600 is a sealed optical semiconductor of the present invention, and the sealed optical semiconductor 600 is provided with an LED chip 601, and a cured product 603 that seals the LED chip 601. The composition of the present invention is the post-heated cured product 603. Note that a substrate 609 is omitted in FIG. 1.

In FIG. 2, the LED chip 601 is bonded to the substrate 609 by, for example, an adhesive or solder (not illustrated), or is connected by means of a flip chip construction. Note that wires, bumps, electrodes, and the like are omitted in FIG. 2.

Additionally, T in FIG. 2 represents a thickness of the cured product 603. Specifically, T is a value arrived at when measuring the thickness of the cured product 603 from an arbitrary point 605 on a surface of the LED chip 601, in a direction perpendicular to a plane 607 on which the point 605 exists.

From the perspectives of ensuring transparency and obtaining superior hermeticity, the thickness of the cured product 603 (T in FIG. 2) of the sealed optical semiconductor of the present invention is preferably not less than 0.1 mm and more preferably from 0.5 to 1 mm.

Figure 3:
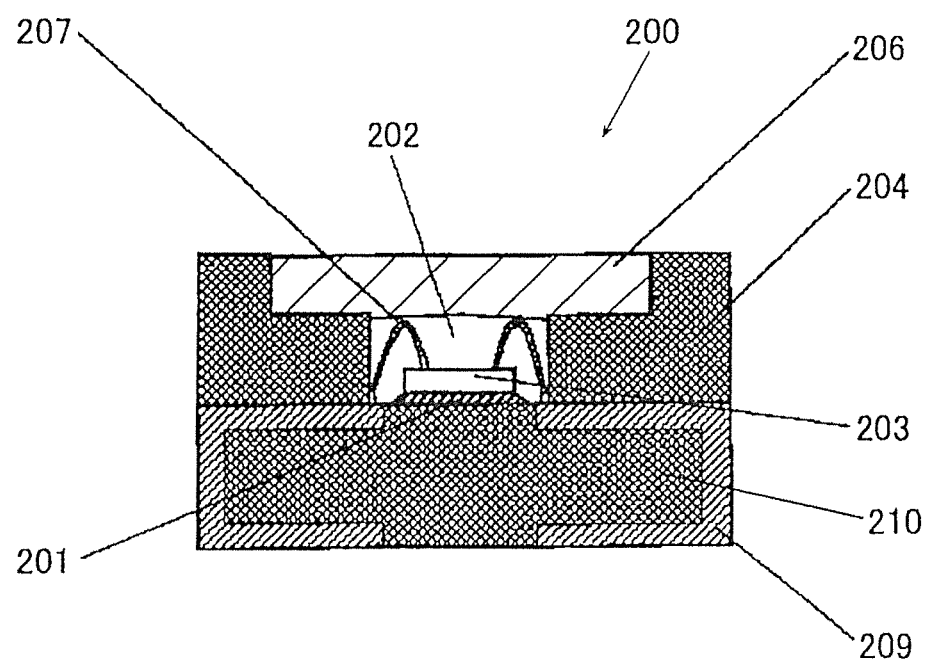
FIG. 3 is a cross-sectional view schematically illustrating an example of a sealed optical semiconductor of the present invention.
Figure 4:
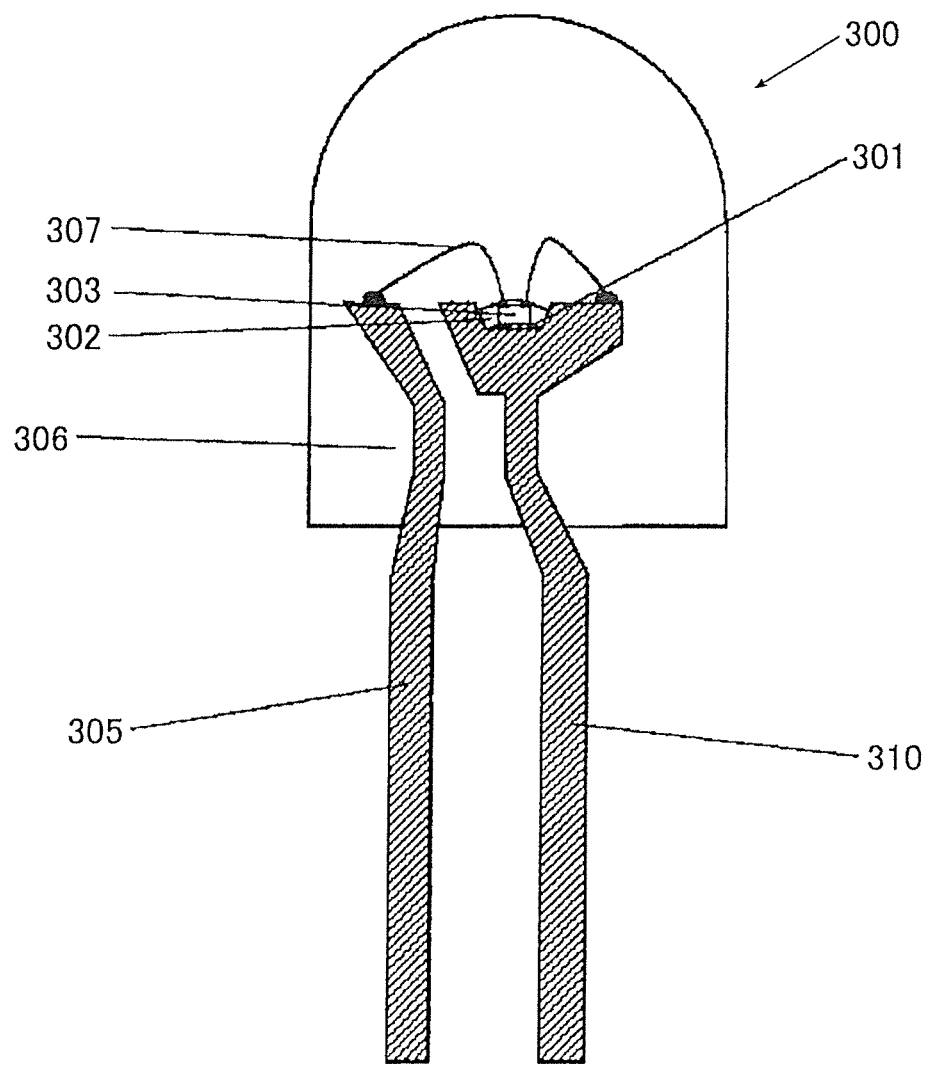
FIG. 4 is a cross-sectional view schematically illustrating an example of a sealed optical semiconductor of the present invention.

A description of an example of the sealed optical semiconductor of the present invention, wherein a white LED is used, is given below while referencing the attached drawings. FIG. 3 is a cross-sectional view schematically illustrating an example of the sealed optical semiconductor of the present invention. FIG. 4 is a cross-sectional view schematically illustrating an example of the sealed optical semiconductor of the present invention.

In FIG. 3, a sealed optical semiconductor 200 has a package 204 on a substrate 210.

A cavity 202 is provided in the package 204. A blue LED chip 203 and a cured product 202 are disposed in the cavity 202. The cured product 202 is formed by curing the composition of the present invention. In this case, the composition of the present invention can include a fluorescent substance that is usable for allowing the sealed optical semiconductor 200 to emit white light.

The blue LED chip 203 is fixed on the substrate 210 by a mount member 201. Each electrode of the blue LED chip 203 (not illustrated) and an external electrode 209 are wire bonded by a conductive wire 207.

The cavity 202 may be filled with the composition of the present invention up to a hatched portion 206.

Additionally, the cavity 202 can be filled with a different composition and the hatched portion 206 can be filled with the composition of the present invention.

In FIG. 4, a sealed optical semiconductor 300 of the present invention has a substrate 310, a blue LED chip 303, and an inner lead 305 in a resin 306 having lamp functionality.

A cavity (not illustrated) is provided in an upper portion of the substrate 310. The blue LED chip 303 and a cured product 302 are disposed in the cavity. The cured product 302 is formed by curing the composition of the present invention. In this case, the composition of the present invention can include a fluorescent substance that is usable for allowing the sealed optical semiconductor 300 to emit white light. Additionally, the resin 306 can be formed using the composition of the present invention.

The blue LED chip 303 is fixed on the substrate 310 by a mount member 301.

Each electrode of the blue LED chip 303 (not illustrated) and the substrate 310 and the inner lead 305 are wire bonded by a conductive wire 307, respectively.

Note that in FIGS. 3 and 4, the LED chip was described as being a blue LED chip, however a red, green, and blue three color LED chip can be disposed in the cavity, or one or two colors selected from a red, green, and blue three color LED chip can be disposed in the cavity. Moreover, based on the color of the LED selected, a fluorescent substance that is usable for allowing the LED chip to emit white light can be added to the composition. The sealed optical semiconductor can be formed by filling the cavity with the composition of the present invention via, for example, a potting process and then heating.

Figure 5:
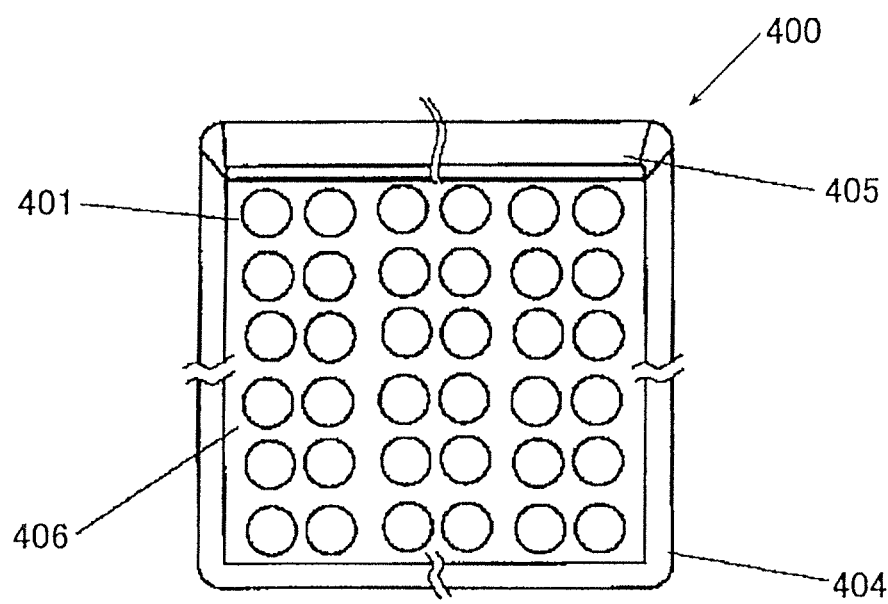
FIG. 5 is a drawing schematically illustrating an example of an LED display unit of the sealed optical semiconductor of the present invention.
Figure 6:
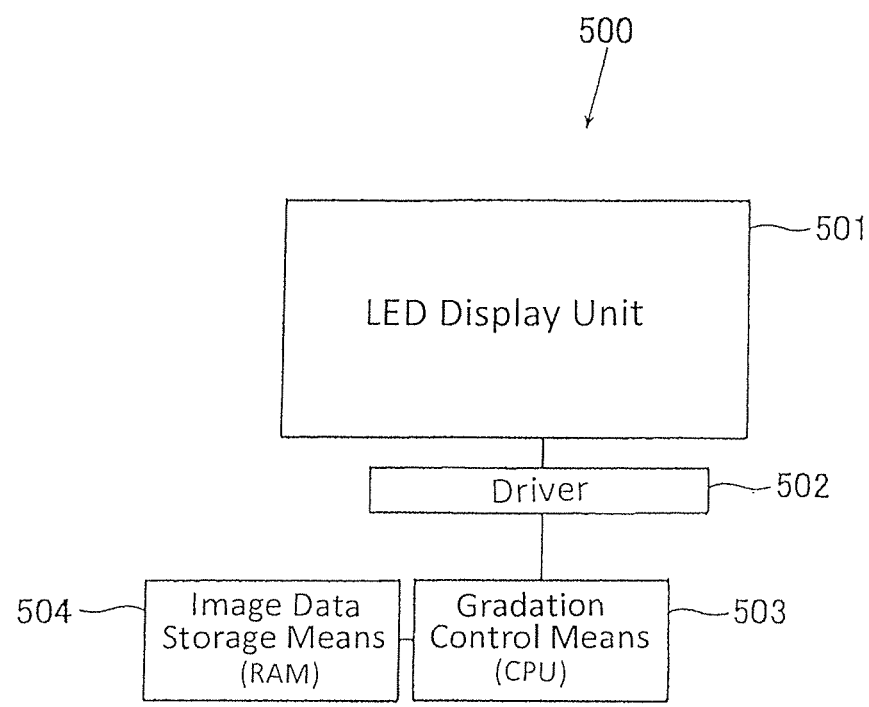
FIG. 6 is a block diagram of an LED display device used for the LED display unit depicted in FIG. 5.

A description of a case where the sealed optical semiconductor of the present invention is used in an LED display unit is given below while referencing the attached drawings. FIG. 5 is a drawing schematically illustrating an example of an LED display unit of the sealed optical semiconductor of the present invention. FIG. 6 is a block diagram of an LED display device used for the LED display unit depicted in FIG. 5. Note that the LED display unit and LED display device in which the sealed optical semiconductor of the present invention is used are not limited to the attached drawings.

In FIG. 5, an LED display unit 400 (the sealed optical semiconductor of the present invention) has a white LED chip 401 disposed matrix-like in a housing 404. The white LED chip 401 is sealed by a cured product 406, and a light blocking member 405 is disposed on a portion of the housing 404. The composition of the present invention can be used as the cured product 406. Additionally, the sealed optical semiconductor of the present invention can be used as the white LED chip 401.

In FIG. 6, a LED display device 500 is provided with an LED display unit 501 that uses white LEDs. The LED display unit 501 is in electrical connection with a lighting circuit (drive circuit) or the like. The LED display unit 501 can be configured so as to be a display or the like capable of displaying various images based on output pulses from the drive circuit. The drive circuit is provided with RAM (random access memory) 504 that temporarily stores display data to be input, a gradation control circuit (CPU) 503 that computes gradation signals from data stored in the RAM 504 for lighting each of the white LEDs to a predetermined brightness, and a driver 502 that is switched by output signals from the gradation control circuit (CPU) 503 and lights the white LEDs. The gradation control circuit (CPU) 503 computes a lighting time of the white LEDs from the data stored in the RAM 504 and outputs a pulse signal. Note that the sealed optical semiconductor of the present invention can be used in LED display units and LED display devices that can display color.

Examples of applications of the sealed optical semiconductor of the present invention include automobile lamps (headlamps, taillamps, direction indicator lamps, and the like), household lighting fixtures, industrial lighting fixtures, stage lighting fixtures, displays, traffic lights, and projectors.

Working Examples

The present invention is described below in detail using working examples but the present invention is not limited to such working examples.

1. Production of the Zirconium Metal Salt (1) Zirconium Tributoxymononaftate (Zirconium Metal Salt 1)

11.4 g (0.026 mol) of zirconium tetrabutoxide having an 87.5 mass % concentration (manufactured by Kanto Chemical Co., Ltd.) and 6.6 g (0.026 mol) of naphthenic acid (manufactured by Tokyo Chemical Industry Co., Ltd.; average number of carbons of the hydrocarbon group bonded to the carboxy group: 15; neutralization value: 220 mg; same hereinafter) were introduced into a three-neck flask, and were stirred for about two hours at room temperature in a nitrogen atmosphere. Thus, the target composite was obtained.

Note that the neutralization value of the naphthenic acid is an amount of KOH necessary to neutralize 1 g of naphthenic acid.

Quantification of the composite was analyzed using a fourier transform infrared spectrophotometer (FT-IR). As a result, it was confirmed that approximately 1,700 $cm^{-1}$ belonging to the COOH derived from carboxylic acid had ablated after the reaction, and a peak derived from COOZr of approximately 1,450 to 1,560 $cm^{-1}$ was confirmed.

The obtained composite is referred to as "zirconium metal salt 1". An average number of carbons of $R^1$ in the naftate group ($R^1$COO—) included in the zirconium metal salt 1 is 15.

(2) Zirconium Tributoxymonoisobutyrate (Zirconium Metal Salt 2)

Other than replacing the 6.6 g of the naphthenic acid with 2.29 g (0.026 mol) of isobutyric acid (manufactured by Kanto Chemical Co., Ltd.) experiments and quantification was performed the same as for the zirconium metal salt 1. The obtained composite is referred to as "zirconium metal salt 2".

(3) Zirconium Tributoxy Mono(2-ethylhexanoate) (Zirconium Metal Salt 3)

Other than replacing the 6.6 g of the naphthenic acid with 3.75 g (0.026 mol) of 2-ethylhexanoic acid (manufactured by Kanto Chemical Co., Ltd.) experiments and quantification was performed the same as for the zirconium metal salt 1. The obtained composite is referred to as "zirconium metal salt 3".

(4) Zirconium Tributoxy Monocyclohexane Carboxylate (Zirconium Metal Salt 4)

Other than replacing the 6.6 g of the naphthenic acid with 3.3 g (0.026 mol) of carboxylic acid (manufactured by Tokyo Chemical Industry Co., Ltd.) experiments and quantification was performed the same as for the zirconium metal salt 1. The obtained composite is referred to as "zirconium metal salt 4".

(5) Zirconium Tributoxy Monobenzene Carboxylate (Zirconium Metal Salt 5)

Other than replacing the 6.6 g of the naphthenic acid with 3.2 g (0.026 mol) of benzoic acid (manufactured by Tokyo Chemical Industry Co., Ltd.) experiments and quantification was performed the same as for the zirconium metal salt 1. The obtained composite is referred to as "zirconium metal salt 5".

(6) Zirconium Dibutoxydinaftate (Zirconium Metal Salt 6)

Other than doubling the 6.6 g (0.026 mol) content of the naphthenic acid, experiments and quantification was performed the same as for the zirconium metal salt 1. The obtained composite is referred to as "zirconium metal salt 6".

(7) Zirconium Butoxytrinaftate (Zirconium Metal Salt 7)

Other than tripling the 6.6 g (0.026 mol) content of the naphthenic acid, experiments and quantification was performed the same as for the zirconium metal salt 1. The obtained composite is referred to as "zirconium metal salt 7".

(8) Zirconium Triisopropoxide Naftate (Zirconium Metal Salt 8)

Other than replacing the zirconium tetrabutoxide with 8.5 g (0.026 mol) of zirconium tetraisopropoxide (manufactured by Kanto Chemical Co., Ltd.) experiments and quantification was performed the same as for the zirconium metal salt 1. The obtained composite is referred to as "zirconium metal salt 8".

(9) Zirconium Trinormalpropoxide Naftate (Zirconium Metal Salt 9)

Other than replacing the zirconium tetrabutoxide with 8.5 g (0.026 mol) of zirconium tetranormalpropoxide (manufactured by Matsumoto Fine Chemical Co. Ltd.) experiments and quantification was performed the same as for the zirconium metal salt 1. The obtained composite is referred to as "zirconium metal salt 9".

2. Evaluation

As described below, a state of initial thin film curing, transmission, heat resistant coloration stability, post-mixing viscosity, cracking when curing, loss on heat, and adhesive strength were evaluated. The results thereof are shown in Tables 1 and 2.

(1) State of Initial Thin Film Curing

The heat-curable silicone resin composition for sealing optical semiconductors obtained as described below was potted on glass so as to have a thickness of not more than 0.3 mm, and then cured at 150° C. The state of initial curing of the obtained thin film initially cured product (thickness: not more than 0.3 mm) was confirmed by touch.

Evaluation standards for the state of initial thin film curing were as follows:
○=Curing by heating took less than four hours;
Δ=Curing by heating took from four to eight hours;
×=Curing by heating took more than eight hours.

(2) Transmission Evaluation Test

In the transmission evaluation test, the heat-curable silicone resin composition for sealing optical semiconductors obtained as described below was cured for four hours at 150° C. Transmission, measured at a wavelength of 400 nm, of the obtained initially cured product and the cured product after the heat resistance test (wherein the initially cured product was further heated for 10 days at 150° C.) (thickness of each was 2 mm) were each measured using an ultraviolet—visible absorption spectrophotometer (manufactured by Shimadzu Corporation) in accordance with JIS K0115:2004. Additionally, a retention rate of the transmittance of the cured product after the heat resistance test with respect to the initial transmittance was calculated using the following equation.

Transmission retention (%)=(transmission after heat resistance test/transmission at initial curing)×100

(3) Heat Resistant Coloration Stability Evaluation Test

The heat-curable silicone resin composition for sealing optical semiconductors obtained as described below was cured for four hours at 150° C. The obtained initially cured product and the cured product after the heat resistance test (wherein the initially cured product was further heated for 10 days at 150° C.) (thickness of each was 2 mm) were each visually observed in order to confirm whether the cured product after heat resistance testing had yellowed compared to the initially cured product.

(4) Post-Mixing Viscosity (Evaluation of Workable Life)

A viscosity of the composition at 25° C. immediately after producing by mixing the constituents shown in Table 1 (initial viscosity), and a viscosity of the composition after allowing the composition to sit for 24 hours at 25° C. from the time of production (viscosity after 24 hours) were measured using an E-type viscometer at RH 50% and 25° C. Thus, an increase viscosity 24 hours after mixing has confirmed. When the viscosity 24 hours after mixing was within 2 times the viscosity immediately after mixing, the composition was evaluated as having sufficient workable life.

(5) Cracking when Curing

The heat-curable silicone resin composition for sealing optical semiconductors obtained as described below was cured for four hours at 150° C. Each of the obtained initially cured products was visually examined for cracking at the time of curing.

(6) Loss on Heat Evaluation Test

In the loss on heat evaluation test, 1.0 g of the heat-curable silicone resin composition for sealing optical semiconductors was cured for four hours at 150° C. The obtained initially cured product was then further heated for 1,000 hours at 200° C. Using a scale, weights of the initially cured product and the cured product after the loss on heat evaluation test were measured. Loss on heat was calculated using the following equation. When the value of the loss on heat was 20 mass % or less, the composition was evaluated to be practical as a heat-curable silicone resin composition for sealing optical semiconductors.

Loss on heat (mass %)=100−(weight of cured product after loss on heat evaluation test/weight of initially cured product)×100

(7) Adhesive Strength

Using a silicone resin spacer with dimensions 25 mm×10 mm×1 mm (height×width×thickness) the obtained heat-curable silicone resin composition for sealing optical semiconductors was poured into an adhered (alumina plate) and cured for four hours at 150° C. The obtained laminate was allowed to sit for 24 hours at 121° C. and 100% RH using a pressure cooker tester. The cured product after the pressure cooker test (PCT) was subjected to a hand-peeling test. After the hand-peeling test, the adhesive strength after the pressure cooker test was evaluated by a failure form of the cured product after the test.

Evaluation standards for the adhesive strength were as follows:
CF=Failure form was cohesive failure;
AF=Failure form was adhesive failure.

3. Fabrication of Samples (Used in the Evaluations of Transmission, Heat Resistant Coloration Stability, and Cracking when Curing)

A description of the fabrication of the samples is given below while referencing the attached drawings.

Figure 7:
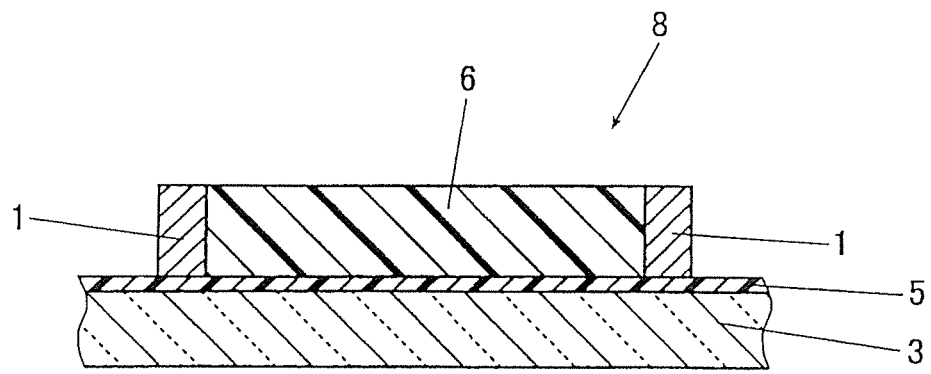
FIG. 7 is a cross-sectional view schematically illustrating a cross-section of a die used for curing compositions of the present invention in the Working Examples.

FIG. 7 is a cross-sectional view schematically illustrating a cross-section of a die used for curing the heat-curable silicone resin composition for sealing optical semiconductors of the present invention in the Working Examples.

In FIG. 7, a die 8 is provided with a PET film 5 on a glass 3 (size of the glass 3=10 cm (height)×10 cm (width)×4 mm (thickness)). A silicone mold spacer 1 (5 cm (height)×5 cm (width)×2 mm (height)) is provided on the PET film 5.

Using the die 8, a composition 6 is poured into an interior portion 6 of the spacer 1, and a sample was cured as follows.

The die 8 filled with the composition 6 was put into an electric oven and heated under the conditions described above to cure the composition 6. Thus, a cured product 6 (initially cured product) having a thickness of 2 mm was produced. The obtained cured product 6 has used as the sample for the transmission, heat resistant coloration stability, and cracking when curing evaluations.

4. Production of the Heat-Curable Silicone Resin Composition for Sealing Optical Semiconductors The heat-curable silicone resin composition for sealing optical semiconductors was produced by uniformly mixing the constituents shown in Tables 1 and 2 at the amounts (unit: parts by mass) shown in the Tables 1 and 2 using a vacuum stirrer.

Note that in Working Examples 1, 2, and 5 of Table 1, the zirconium metal salt is used alone as the silanol condensation catalyst. In Working Examples 3 and 4 of Table 1, the compositions were produced using the zirconium metal salt and the tin compound as the silanol condensation catalyst, and adding both the zirconium metal salt and the tin compound to the heat-curable silicone resin composition for sealing optical semiconductors.

Additionally, in Working Examples II-1, 7, 8, 10, 12, and 14 of Table 2, the zirconium metal salt is used alone as the silanol condensation catalyst. In Working Examples II-2 to 6, 9, 11, 13, and 15 to 17 of Table 2, the compositions were produced using the zirconium metal salt and the tin compound as the silanol condensation catalyst, and adding both the zirconium metal salt and the tin compound to the heat-curable silicone resin composition for sealing optical semiconductors.

TABLE 1

|  | Working Examples ||||| Comparative Examples ||||||
| --- | --- | --- | --- | --- | --- | --- | --- | --- | --- | --- | --- |
|  | 1 | 2 | 3 | 4 | 5 | 1 | 2 | 3 | 4 | 5 | 6 |
| (A) Polysiloxane 1 | 100 |  |  |  |  |  |  |  |  |  |  |
| (A) Polysiloxane 2 |  | 100 | 100 | 100 | 100 | 100 | 100 | 100 | 100 | 100 |  |
| Epoxy silicone |  |  |  |  |  |  |  |  |  |  | 100 |
| (B) Silane compound 1 | 25 |  |  |  |  |  |  |  | 5 |  |  |
| (B) Silane compound 2 |  | 5 | 1 | 5 |  | 5 | 5 |  | 5 | 5 |  |
| (B) Silane compound 3 |  |  | 3 |  | 5 |  |  |  |  |  |  |
| (C) Zirconium metal salt 1 | 0.03 | 0.05 | 0.03 |  |  |  |  |  |  |  |  |
| (C) Zirconium metal salt 2 |  |  |  | 0.03 |  |  |  |  |  |  |  |
| (C) Zirconium metal salt 3 |  |  |  |  | 0.05 |  |  |  |  |  |  |
| Zirconium chelate |  |  |  |  |  |  |  | 0.1 |  |  |  |
| Zirconium tetrabutoxide |  |  |  |  |  |  |  |  | 0.05 | 0.03 |  |
| Tin compound |  |  | 0.02 | 0.02 |  |  | 0.02 |  |  | 0.02 |  |
| Zirconium naphthenate |  |  |  |  |  | 0.05 | 0.03 |  |  |  |  |
| Cationic polymerization catalyst |  |  |  |  |  |  |  |  |  |  | 0.1 |
| State of initial thin film curing | ○ | ○ | ○ | ○ | Δ | x | x | x | Not cured | x | x |
| Transmission (%) Initial | 88 | 88 | 88 | 87 | 90 | 88 | 88 | 90 | — | 90 | 91 |
| Transmission (%) After heat resistance test | 87 | 87 | 87 | 86 | 89 | 87 | 87 | 87 | — | 89 | 57 |
| Transmission retention (%) | 99 | 99 | 99 | 99 | 99 | 99 | 99 | 97 | — | 99 | 64 |
| Heat resistant coloration stability | No yellowing | No yellowing | No yellowing | No yellowing | No yellowing | No yellowing | No yellowing | No yellowing | — | No yellowing | Yellowing |
| Viscosity increase 24 hrs. after mixing | No increase | No increase | Increased 1.2 times | Increased 1.2 times | No increase | No increase | No increase | No increase | — | No increase | No increase |
| Cracking when curing | None | None | None | None | None | None | None | None | — | None | None |

TABLE 1-continued

|  | Working Examples | | | | | Comparative Examples | | | | | |
| --- | --- | --- | --- | --- | --- | --- | --- | --- | --- | --- | --- |
|  | 1 | 2 | 3 | 4 | 5 | 1 | 2 | 3 | 4 | 5 | 6 |
| Loss on heat (mass %) | 4.1 | 3.9 | 4.1 | 3.9 | 5.9 | 5.0 | 4.5 | 18.0 | — | 5.0 | — |
| Adhesive strength (PCT) | CF | CF | CF | CF | CF | AF | AF | CF | — | CF | — |

The components shown in Table 1 are as follows.
(A) Polysiloxane 1: Polydimethyl siloxane-α,ω-diol (weight-average molecular weight: 1,000), trade name: x-21-5841, manufactured by Shin-Etsu Chemical Co., Ltd.
(A) Polysiloxane 2: Polydimethyl siloxane-α,ω-diol, trade name: x-21-5848 (manufactured by Shin-Etsu Chemical Co., Ltd.; weight-average molecular weight: 110,000)
Epoxy silicone: Epoxy-modified polysiloxane (trade name: KF101, manufactured by Shin-Etsu Chemical Co., Ltd.)
(B) Silane compound 1: γ-methacryloxypropyltrimethoxysilane (molecular weight: 248), trade name: KBM503, manufactured by Shin-Etsu Chemical Co., Ltd.
(B) Silane compound 2: Silicone alkoxy oligomer [$R_m$Si(OR')$_n$O$_{(4-m-n)/2}$; in the formula R is an alkyl group, an alkynyl group, or an aryl group having from 1 to 6 carbons; R' is an alkyl group having from 1 to 6 carbons; m is such that 0
(B) Silane compound 3: Tetraethoxysilane (molecular weight: 208), manufactured by Tama Chemicals Co., Ltd.
(C) Zirconium metal salts 1 to 3: The zirconium metal salts 1 to 3 produced as described above.
Zirconium chelate: Zirconium tributoxy monoacetylacetonate (manufactured by Matsumoto Trading Co., Ltd.)
Zirconium tetrabutoxide: Zirconium tetrabutoxide with a concentration of 87.5 mass % (manufactured by Kanto Chemical Co., Ltd.; Note that the content of the zirconium tetrabutoxide shown in Table 1 is a net content of the zirconium tetrabutoxide)
Tin compound: Dibutyltin diacetate, manufactured by Nitto Kasei Co., Ltd.
Zirconium naphthenate: Manufactured by Nihon Kagaku Sangyo Co., Ltd.
Cationic polymerization catalyst: $BF_3 \cdot Et_2O$ ($BF_3$-ethyl etherate complex, manufactured by Tokyo Chemical Industry Co., Ltd.)

As is clear from the results shown in Table 1, Comparative Examples 1 and 2, which included zirconium naphthenate in place of the zirconium metal salt, displayed inferior thin film curability and adhesive strength. Additionally, Comparative Example 3, which included the zirconium chelate complex in place of the zirconium metal salt, displayed inferior thin film curability and had a large amount of loss on heat. Comparative Example 4, which did not include the zirconium metal salt and did include the zirconium tetrabutoxide, did not cure at all even when subjected to 150° C. for more than eight hours for the purpose of evaluating the state of initial thin film curing. Comparative Example 5, which did not include the zirconium metal salt and did include the zirconium tetrabutoxide and the tin compound, displayed inferior thin film curability. Comparative Example 6, which included the epoxy silicone, displayed inferior thin film curability and heat resistant coloration stability.

In contrast, Working Examples 1 to 5 displayed superior heat resistant coloration stability and thin film curability. Particularly, Working Examples 1 to 4, which included the zirconium metal salt 1 or the zirconium metal salt 2 as the zirconium metal salt, displayed superior thin film curability.

Additionally, Working Examples 1 to 5 displayed loss on heat that was equal to or less than that of Comparative Examples 1 and 2, which included the zirconium naphthenate (loss on heat was able to be suppressed to 10 mass % or less). Therefore, the composition of the present invention can suppress loss on heat and has superior heat resistance.

Moreover, in Working Examples 1 to 5 the results of the failure test following PCT testing indicated cohesive failure, thus indicating high adhesive strength (adhesive strength under conditions of elevated temperatures, moisture, and high pressures).

Furthermore, Working Examples 1 to 5 displayed superior transparency; high transmission and transmission retention; did not display cracking; had a low post-mixing viscosity; and displayed a superior pot life.

TABLE 2

|  | Working Examples II | | | | | | | | | | | |
| --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 |
| (C) Zirconium metal salt 1 | 0.05 | | | | | 0.03 | | | | | | |
| (C) Zirconium metal salt 4 | | 0.07 | | | | | | | | | | |
| (C) Zirconium metal salt 2 | | | 0.03 | | | | | | | | | |
| (C) Zirconium metal salt 5 | | | | 0.05 | | | | 0.05 | | | | |
| (C) Zirconium metal salt 3 | | | | | 0.1 | | | | | | | |
| (C) Zirconium metal salt 6 | | | | | | | | | 0.05 | 0.04 | | |
| (C) Zirconium metal salt 7 | | | | | | | | | | | 0.05 | 0.03 |

TABLE 2-continued

| | | | | | | | | | | | | | |
|---|---|---|---|---|---|---|---|---|---|---|---|---|---|
| (C) Zirconium metal salt 8 | | | | | | | | | | | | | 0.05 |
| (C) Zirconium metal salt 9 | | | | | | | | | | | | | |
| Zirconium tetracarboxylic acid ester | | | | | | | | | | | | | |
| Zirconium chelate | | | | | | | | | | | | | |
| Zirconium tetrabutoxide | | | | | | | | | | | | | |
| Tin compound 1 | | | 0.02 | 0.02 | 0.02 | 0.03 | 0.02 | | | 0.03 | | 0.02 | |
| (A) Polysiloxane 1 | | 100 | | | | | | | | | | | |
| (A) Polysiloxane 2 | | | 100 | 100 | 100 | 100 | 100 | 100 | 100 | 100 | 100 | 100 | 100 |
| (B) Silane compound 1 | | | | | | | | | | | | | |
| (B) Silane compound 2 | | | 5 | 5 | 5 | 5 | | 5 | 5 | 5 | 5 | 5 | 5 | 5 |
| (B) Silane compound 3 | | | | | | | 5 | | | | | | | |
| (B) Silane compound 4 | | | | | | | | | | | | | | |
| Adhesion promoter | | | | | | | | | | | | | | |
| State of initial thin film curing | | | ○ | ○ | Δ | ○ | Δ | ○ | ○ | ○ | ○ | ○ | ○ | ○ |
| Transmission (%) | Initial | | 88 | 88 | 90 | 87 | 90 | 90 | 90 | 90 | 90 | 90 | 90 | 90 |
| | Heat resistance test (200° C., after 1,000 hrs.) | | 87 | 87 | 89 | 86 | 89 | 89 | 89 | 88 | 89 | 89 | 89 | 89 |
| Transmission retention (%) | | | 99 | 99 | 99 | 99 | 99 | 99 | 99 | 98 | 99 | 99 | 99 | 99 |
| Heat resistant coloration stability | | | No yellowing | No yellowing | No yellowing | No yellowing | No yellowing | No yellowing | No yellowing | No yellowing | No yellowing | No yellowing | No yellowing | No yellowing |
| Viscosity increase 24 hrs. after mixing | | | No increase | Increased 1.2 times | No increase | Increased 1.2 times | No increase | No increase | No increase | No increase | No increase | No increase | No increase | No increase |
| Cracking when curing | | | None | None | None | None | None | None | None | None | None | None | None | None |
| Loss on heat (mass %) | | | 3.9 | 4.1 | 3.5 | 3.9 | 5.9 | 4.1 | 3.5 | 4.4 | 4.2 | 4.3 | 4.4 | 4.3 |
| Adhesive strength (PCT) | | | CF | CF | CF | CF | CF | CF | CF | CF | CF | CF | CF | CF |

| | Working Examples II | | | | | Comparative Exmples II | | | | | |
|---|---|---|---|---|---|---|---|---|---|---|---|
| | 13 | 14 | 15 | 16 | 17 | 1 | 2 | 3 | 4 | 5 | 6 |
| (C) Zirconium metal salt 1 | | | | | | | | | | | |
| (C) Zirconium metal salt 4 | | | | | | | | | | | |
| (C) Zirconium metal salt 2 | | | 0.03 | 0.03 | 0.03 | | | | | | |
| (C) Zirconium metal salt 5 | | | | | | | | | | | |
| (C) Zirconium metal salt 3 | | | | | | | | | | | |
| (C) Zirconium metal salt 6 | | | | | | | | | | | |
| (C) Zirconium metal salt 7 | | | | | | | | | | | |
| (C) Zirconium metal salt 8 | 0.03 | | | | | | | | | | |
| (C) Zirconium metal salt 9 | | 0.05 | | | | | | | | | |
| Zirconium tetracarboxylic | | | | | | | | | | | 0.05 |

TABLE 2-continued

| | 1 | 2 | 3 | 4 | 5 | 6 | 7 | 8 | 9 | 10 | 11 |
|---|---|---|---|---|---|---|---|---|---|---|---|
| acid ester Zirconium chelate | | | | | | 0.1 | | | | | |
| Zirconium tetrabutoxide | | | | | | | 0.1 | 0.1 | | | |
| Tin compound 1 | 0.02 | 0.02 | 0.02 | 0.02 | | | 0.03 | 0.1 | 0.02 | | |
| (A) Polysiloxane 1 | | | 100 | | 100 | 100 | | | | | |
| (A) Polysiloxane 2 | 100 | 100 | | 100 | | | 100 | 100 | 100 | 100 | 100 |
| (B) Silane compound 1 | | | | | | | | | | | |
| (B) Silane compound 2 | 5 | 5 | | 5 | | 5 | 5 | | 5 | 5 | 5 |
| (B) Silane compound 3 | | | | | | | | 5 | | | |
| (B) Silane compound 4 | | | 1000 | | 1000 | | | | | | |
| Adhesion promoter | | | 1 | | 1 | | | | | | |
| State of initial thin film curing | ○ | ○ | ○ | ○ | ○ | Δ | Not cured | Not cured | Δ | Not cured | Not cured |
| Transmission (%) Initial | 90 | 90 | 90 | 90 | 90 | 88 | — | — | 90 | — | — |
| Transmission (%) Heat resistance test (200° C., after 1,000 hrs.) | 89 | 88 | 89 | 89 | 89 | 70 | — | — | 88 | — | — |
| Transmission retention (%) | 99 | 98 | 99 | 99 | 99 | 82 | — | — | 98 | — | — |
| Heat resistant coloration stability | No yellowing | No yellowing | No yellowing | No yellowing | No yellowing | Yellowing | — | — | No yellowing | — | — |
| Viscosity increase 24 hrs. after mixing | No increase | No increase | No increase | No increase | No increase | No increase | — | — | Gelation | — | — |
| Cracking when curing | None | None | None | None | None | None | — | — | None | — | — |
| Loss on heat (mass %) | 3.9 | 4.0 | 4.1 | 3.9 | 4.1 | 18.0 | — | — | 5.1 | — | — |
| Adhesive strength (PCT) | CF | CF | CF | CF | CF | AF | — | — | AF | — | — |

The components shown in Table 2 are as follows.

(C) Zirconium metal salts 1 to 9: The zirconium metal salts 1 to 9 produced as described above.

Zirconium tetracarboxylic acid ester: Zirconium tetra(2-ethylhexanoate) (manufactured by Gelest)

Zirconium chelate: Zirconium tetraacetylacetonate (manufactured by Matsumoto Trading Co., Ltd.)

Zirconium tetrabutoxide: Zirconium tetrabutoxide with a concentration of 87.5 mass % (manufactured by Kanto Chemical Co., Ltd.; Note that the content of the zirconium tetrabutoxide shown in Table 2 is a net content of the zirconium tetrabutoxide)

Tin compound 1: Dibutyltin diacetate, manufactured by Nitto Kasei Co., Ltd.

(A) Polysiloxane 1: Polydimethyl siloxane-α,ω-diol (weight-average molecular weight: 6,000), trade name: x-21-5841, manufactured by Shin-Etsu Chemical Co., Ltd.

(A) Polysiloxane 2: Polydimethyl siloxane-α,ω-diol, trade name: x-21-5848 (manufactured by Shin-Etsu Chemical Co., Ltd.; weight-average molecular weight: 110,000)

(B) Silane compound 1: γ-methacryloxypropyltrimethoxysilane (molecular weight: 248), trade name: KBM503, manufactured by Shin-Etsu Chemical Co., Ltd.

(B) Silane compound 2: Silicone alkoxy oligomer (weight-average molecular weight: 6,000), trade name: x-40-9246, manufactured by Shin-Etsu Chemical Co., Ltd.

(B) Silane compound 3: Tetraethoxysilane (molecular weight: 208), manufactured by Tama Chemicals Co., Ltd.

(B) Silane compound 4: 20 parts by weight of tetramethoxysilane (manufactured by Shin-Etsu Chemical Co., Ltd.; trade name: KBM-04) and 0.01 parts by weight of 2-ethylhexanetin (manufactured by Kanto Chemical Co., Ltd.) were added per 100 parts by weight of a polydimethyl siloxane terminated at both ends by a silanol (trade name: ss70; manufactured by Shin-Etsu Chemical Co., Ltd.; Mw=18000). The mixture was stirred at 60° C. for eight hours while reducing pressure. Thereafter, residual tetramethoxysilane was removed at 130° C. for eight hours under reduced pressure. Thus, a polydimethyl siloxane modified at both ends by a trimethoxysilyloxy group was obtained. Ablation of the peak of the silanol was confirmed via proton NMR.

Adhesion promoter: 1,6-bis trimethoxysilylhexane (trade name: z-6830; manufactured by Dow Corning Toray Co., Ltd.)

As is clear from the results shown in Table 2, Comparative Example II-1, which included the zirconium chelate in place of the zirconium metal salt displayed inferior thin film curability, heat resistant coloration stability, and adhesive strength, and a large amount of loss on heat. Additionally, Comparative Examples II-2 and 3, which included the zirconium tetra alkoxide in place of the zirconium metal salt; Comparative Example II-5, which did not include the zirconium metal salt and did include the tin compound; Comparative Example II-6, which did not include the zirconium metal salt and did include a zirconium tetracarboxylic acid ester did not cure at all even when subjected to 150° C. for more than eight hours for the purpose of evaluating the state of initial thin film curing. In Comparative Example 11-4, which did not include the zirconium metal salt and did include the tin compound, gelation occurred after mixing and, thus, displayed inferior pot life.

In contrast, Working Examples II-1 to 17 displayed superior heat resistant coloration stability and thin film curability. Particularly, Working Examples II-1, 2, 4, and 6 to 14, which had a zirconium metal salt with a ring structure, displayed superior thin film curability.

Additionally, Working Examples II-1 to 17 displayed loss on heat that was equal to or less than that of Comparative Examples 1 and 2 of Table 1, which included the zirconium naphthenate. Therefore, the composition of the present invention can suppress loss on heat and has superior heat resistance.

Moreover, in Working Examples II-1 to 17 the results of the failure test following PCT testing indicated cohesive failure, thus indicating high adhesive strength (adhesive strength under conditions of elevated temperatures, moisture, and high pressures).

Furthermore, Working Examples II-1 to 17 displayed superior transparency; high transmission and transmission retention; did not display cracking; had a low post-mixing viscosity; and displayed a superior pot life.

What is claimed is:

1. A heat-curable silicone resin composition for sealing optical semiconductors comprising:
   (A) 100 parts by mass of a polysiloxane containing two or more silanol groups in the molecule;
   (B) from 0.1 to 2,000 parts by mass of a silane compound containing two or more alkoxy groups that are bonded to a silicon atom in the molecule; and
   (C) a zirconium metal salt expressed by Formula (I):

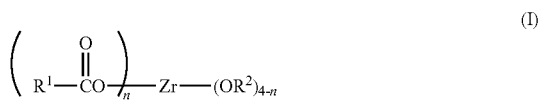

(wherein n is an integer from 1 to 3; each $R^1$ is a hydrocarbon group having from 1 to 16 carbons; and each $R^2$ is a hydrocarbon group having from 1 to 18 carbons); and the $R^1$ of Formula (I) is at least one selected from the group consisting of a cyclopropyl group, a cyclopentyl group, a cyclohexyl group, an adamanthyl group, and a naphthene ring.

2. The heat-curable silicone resin composition for sealing optical semiconductors according to claim 1, further comprising from 0.001 to 5 parts by mass of a quaternary tin compound containing an alkyl group and an acyl group per a total 100 parts by mass of the polysiloxane and the silane compound.

3. The heat-curable silicone resin composition for sealing optical semiconductors according to claim 2, wherein a content of the zirconium metal salt is from 0.001 to 5 parts by mass per the total 100 parts by mass of the polysiloxane and the silane compound.

4. The heat-curable silicone resin composition for sealing optical semiconductors according to claim 1, wherein a content of the zirconium metal salt is from 0.001 to 5 parts by mass per the total 100 parts by mass of the polysiloxane and the silane compound.

5. The heat-curable silicone resin composition for sealing optical semiconductors according to claim 4, further comprising from 0.001 to 5 parts by mass of a quaternary tin compound containing an alkyl group and an acyl group per a total 100 parts by mass of the polysiloxane and the silane compound.

6. The heat-curable silicone resin composition for sealing optical semiconductors according to claim 1, comprising a straight chain organopolydimethylsiloxane having a weight-average molecular weight of from 1,000 to 1,000,000, expressed by Formula (1) below, as the polysiloxane:

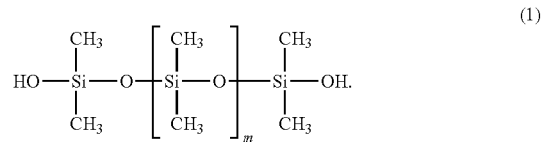

where m is an integer from 10 to 15,000.

7. The heat-curable silicone resin composition for sealing optical semiconductors according to claim 6, wherein a content of the zirconium metal salt is from 0.001 to 5 parts by mass per the total 100 parts by mass of the polysiloxane and the silane compound.

8. The heat-curable silicone resin composition for sealing optical semiconductors according to claim 1, further comprising from 0.1 to 5 parts by mass of bis(alkoxysilyl)alkane per the total 100 parts by mass of the polysiloxane and the silane compound.

9. The heat-curable silicone resin composition for sealing optical semiconductors according to claim 8, comprising a straight chain organopolydimethylsiloxane having a weight-average molecular weight of from 1,000 to 1,000,000, expressed by Formula (1) below, as the polysiloxane:

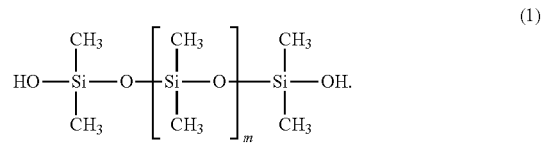

wherein m is an integer from 10 to 15,000.

10. A sealed optical semiconductor formed by sealing a LED chip by:
   applying a heat-curable silicone resin composition for sealing optical semiconductors described in claim 1 to the LED chip,
   heating the LED chip, and
   curing the heat-curable silicone resin composition for sealing optical semiconductors.

11. A heat-curable silicone resin composition for sealing optical semiconductors comprising:
   (A) 100 parts by mass of a polysiloxane containing two or more silanol group in the molecule;

(B) from 0.1 to 2,000 parts by mass of a silane compound containing two or more alkoxy group that are bonded to a silicon atom in the molecule;

(C) a zirconium metal salt expressed by Formula (I):

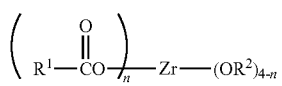

(wherein n is an integer from 1 to 3; each $R^1$ is a hydrocarbon group having from 1 to 16 carbons; and each $R^2$ is a hydrocarbon group having from 1 to 18 carbons); and from 0.1 to 5 parts by mass of bis(alkoxysilyl)alkane per the total 100 parts by mass of the polysiloxane and the silane compound.

12. A sealed optical semiconductor formed by sealing a LED chip by:

applying a heat-curable silicone resin composition for sealing optical semiconductors to the LED chip, the heat-curable silicone rein composition for sealing optical semiconductors comprising:

(A) 100 parts by mass of a polysiloxane containing two or more silanol group in the molecule;

(B) from 0.1 to 2,000 parts by mass of a silane compound containing two or more alkoxy group that are bonded to a silicon atom in the molecule; and (C) a zirconium metal salt expressed by Formula (I):

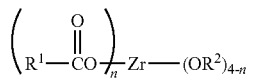

(wherein n is an integer from 1 to 3; each $R^1$ is a hydrocarbon group having from 1 to 16 carbons; and each $R^2$ is a hydrocarbon group having from 1 to 18 carbons), heating the LED chip, and curing the heat-curable silicone resin composition for sealing optical semiconductors.

* * * * *